(12) United States Patent
Bozano et al.

(10) Patent No.: US 7,993,812 B2
(45) Date of Patent: Aug. 9, 2011

(54) CALIXARENE BLENDED MOLECULAR GLASS PHOTORESISTS AND PROCESSES OF USE

(75) Inventors: Luisa D. Bozano, Los Gatos, CA (US); Hiroshi Ito, San Jose, CA (US); Atsuko Ito, legal representative, San Jose, CA (US); Linda K. Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 12/507,968

(22) Filed: Jul. 23, 2009

(65) Prior Publication Data

US 2011/0020756 A1 Jan. 27, 2011

(51) Int. Cl.
*G03F 7/004* (2006.01)
*G03F 7/30* (2006.01)

(52) U.S. Cl. ............... 430/270.1; 430/326; 430/905

(58) Field of Classification Search ........... 430/270.1, 430/326, 905
See application file for complete search history.

(56) References Cited

U.S. PATENT DOCUMENTS

| | | | |
|---|---|---|---|
| 5,143,784 A | 9/1992 | Mita | |
| 5,679,495 A | 10/1997 | Yamachika et al. | |
| 6,093,517 A * | 7/2000 | Ito et al. | 430/270.1 |
| 6,197,473 B1 | 3/2001 | Kihara et al. | |
| 6,713,225 B2 | 3/2004 | Iida et al. | |
| 7,037,638 B1 | 5/2006 | Afzali-Ardakani et al. | |
| 7,141,692 B2 | 11/2006 | Allen et al. | |
| 2006/0188809 A1 | 8/2006 | Hatakeyama et al. | |
| 2007/0122734 A1 | 5/2007 | Roberts et al. | |
| 2007/0123736 A1 | 5/2007 | Nishikubo et al. | |
| 2007/0190451 A1 | 8/2007 | Ishii et al. | |
| 2008/0081282 A1 | 4/2008 | Kamimura et al. | |

OTHER PUBLICATIONS

Reichmanis, E., et al. "Chemical Amplification Mechanisms for Microlithography", Chem. Mater. 1991, vol. 3, pp. 394-407.
Yamakawa, Yoshitaka et al., "Rapid synthesis of dendrimers based on calix[4]resorcinarenes", J. Chem. Soc., Perkin Trans. 1, 1998, pp. 4135-4139.
Ito, Hiroshi et al., "Characterization and Lithographic Application of Calix[4]resorcinarene Derivatives", © 2008 American Chemical Society, Chem. Mater. 2008, 20, pgs. 341-356, published on the web Dec. 11, 2007.

* cited by examiner

*Primary Examiner* — John S Chu
(74) *Attorney, Agent, or Firm* — Cantor Colburn LLP

(57) ABSTRACT

Photoresist compositions include a blend of at least one fully protected calix[4]resorcinarene and at least one unprotected calix[4]resorcinarene, wherein the fully protected calix[4]resorcinarene has phenolic groups protected with acid labile protective groups; a photoacid generator; and a solvent, and wherein the blend and the photoacid generator are soluble in the solvent. Also disclosed are processes for generating a resist image on a substrate using the photoresist composition.

20 Claims, 23 Drawing Sheets

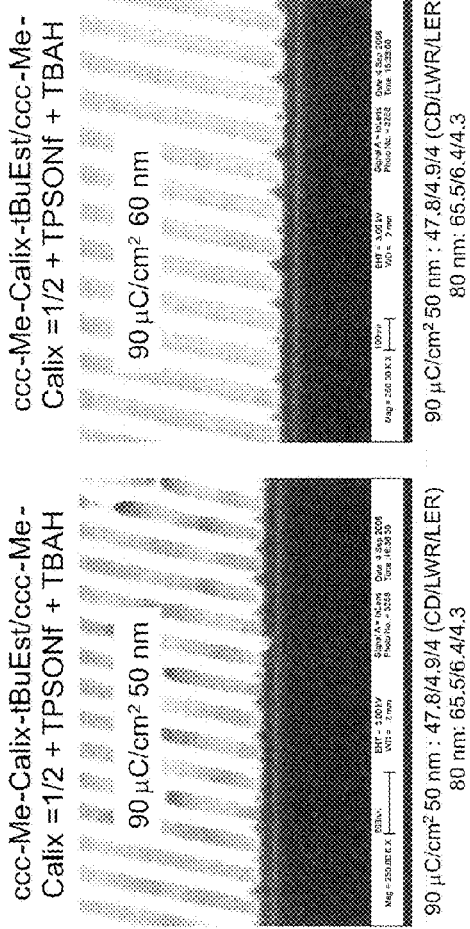
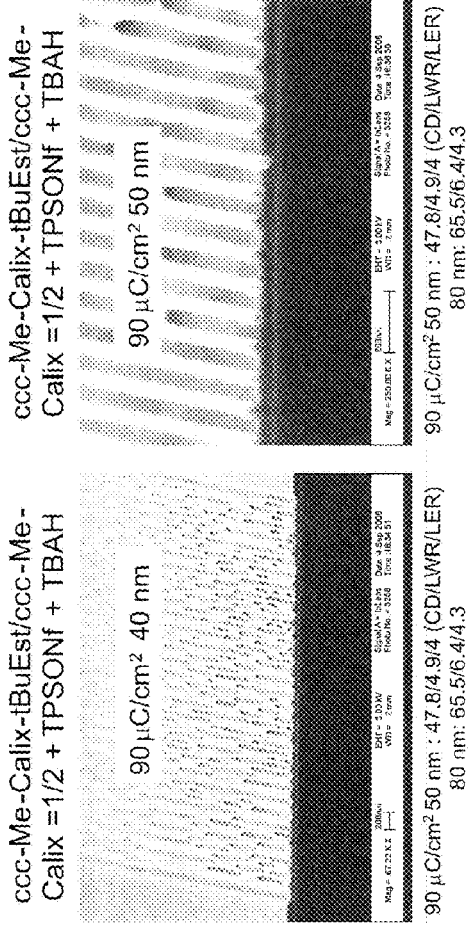
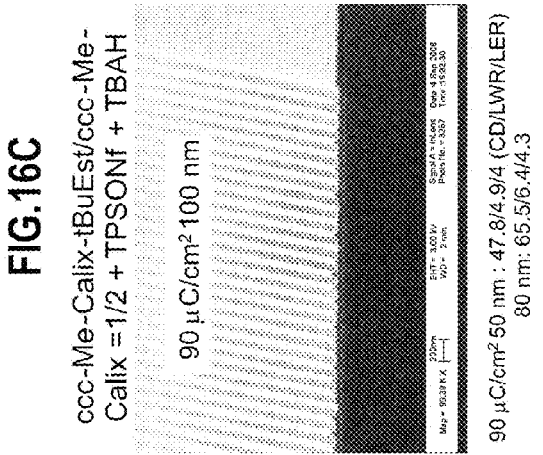
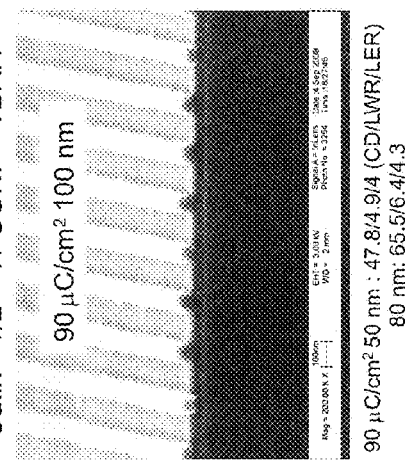
FIG.16A FIG.16B FIG.16C FIG.16D FIG.16E

US 7,993,812 B2

CALIXARENE BLENDED MOLECULAR GLASS PHOTORESISTS AND PROCESSES OF USE

BACKGROUND

The at least one fully protected and/or the at least one fully unprotected calix[4]resorcinarene can have a calixarene structure selected from the group consisting of C-tetramethyl-calix[4]resorcinarene, C-tetraphenyl-calix[4]resorcinarene, and C-isopropylphenyl-calix[4]resorcinarene.

As the minimum critical dimension continues to shrink to less than 50 nanometers (nm), it is becoming increasingly difficult to simultaneously meet critical performance criteria, sensitivity, resolution, and line edge roughness (LER). The size of polymers typically employed in chemical amplification photoresists is beginning to influence performance at these dimensions. For example, it is believed that the magnitude of line edge roughness is directly correlated to the molecular weight of the base polymer in the photoresist. As a result, a number of photoresists based on low molecular weight polymers or non-polymers have been proposed to address the performance issues needed for these advanced design rules.

Calixarenes are non-polymeric phenolic macrocyclic compounds that have recently attracted a great deal of attention. Calixarenes were discovered and methods of synthesis devised in the 1950's. Initial work with these compounds focused on potential biological applications, particularly in constructing systems for mimicking the catalytic activity of certain enzymes. Other work has suggested utility as synthetic analogues of cyclodextrins, and in extraction and separation processes. With regard to the use of calixarenes in device manufacture, calixarenes that have been partially protected with acid labile groups have been extensively evaluated as molecular glass resists and dissolution inhibitors. In these molecular glass applications, the partially protected calix[4]resorcinarenes were claimed to be structurally monomodal whereas, in actuality, partial protection of ccc and ctt isomer mixtures resulted in highly multimodal distributions of the isomeric structures. However, truly monomodal 100% protected pure isomers have been employed as dissolution inhibitors.

While lithographic results from the use of partially protected calixarenes in positive tone resists has shown some promise, increased performance robustness is needed.

SUMMARY

According to one embodiment of the present invention, a positive-tone photoresist composition comprises a blend of at least one fully protected calix[4]resorcinarene and at least one unprotected calix[4]resorcinarene, wherein the fully protected calix[4]resorcinarene has phenolic groups protected with an acid labile protective group; a photoacid generator; and a solvent, wherein the blend and the photoacid generator are soluble in the solvent.

A process for generating a resist image on a substrate, comprises coating a substrate with a film comprising the resist composition comprising a blend of at least one fully protected calix[4]resorcinarene and at least one unprotected calix[4]resorcinarene, a photoacid generator, and a solvent; imagewise exposing the film to radiation to form latent image therein; and developing the resist image with an aqueous base developer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

FIG. 16 (A-E) pictorially illustrates cross-sectional scanning electron micrographs of 1:1 line space patterns printed from a molecular glass photoresist including 33 weight percent of fully t-butoxycarbonylmethyl-protected (ccc) C-tetramethyl-calix[4]resorcinarenes by 100 KeV e-beam.

DETAILED DESCRIPTION

Figure 1:
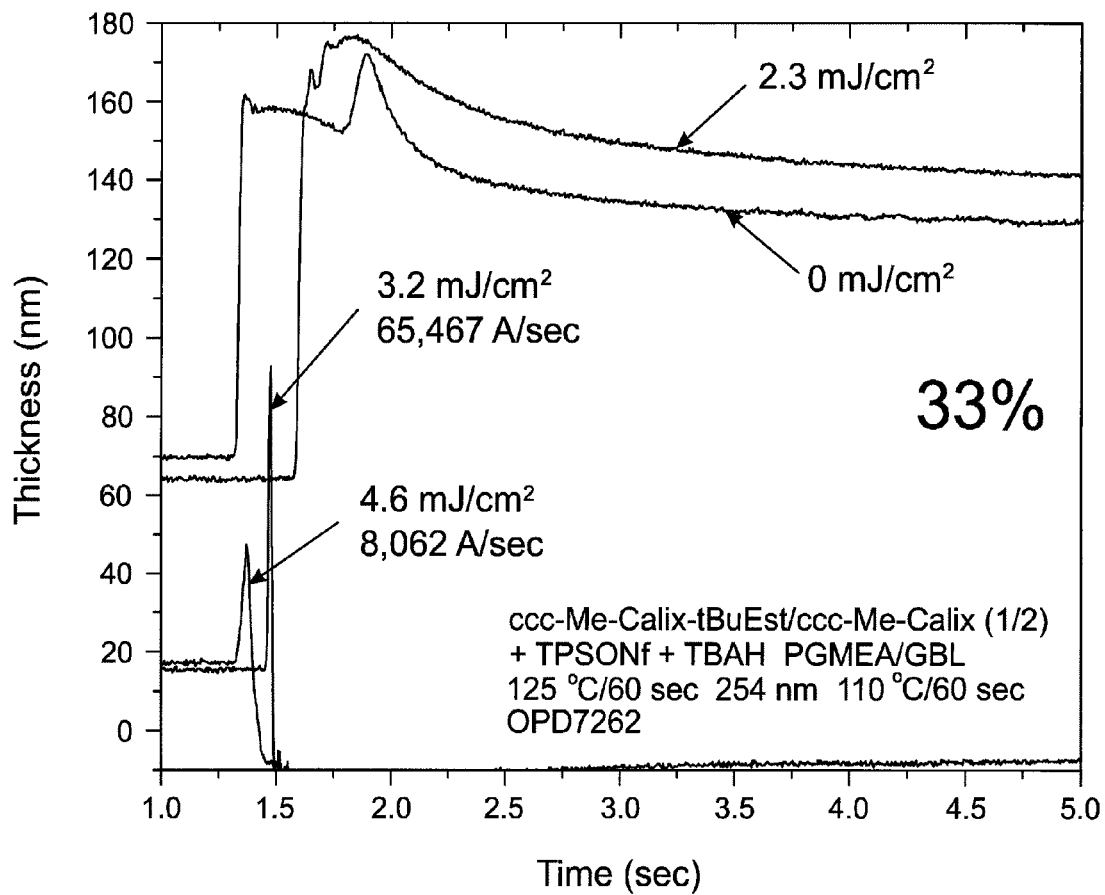
FIGS. 1-4 graphically illustrate dissolution kinetics curves of blend molecular glass resists with a varying ratio of fully t-butoxycarbonylmethyl-protected to unprotected (ccc) C-tetramethyl-calix[4]resorcinarenes in 0.26 N TMAH.
Figure 2:
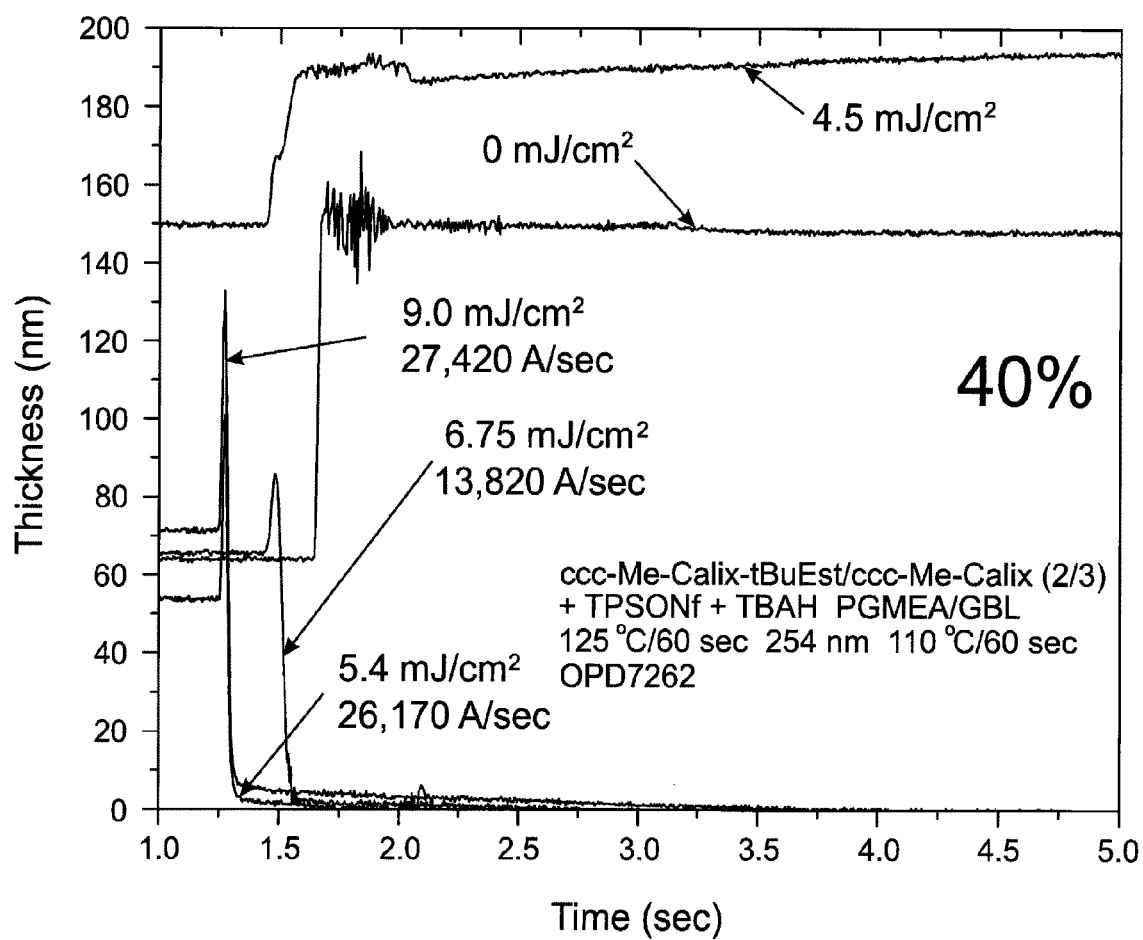
Figure 3:
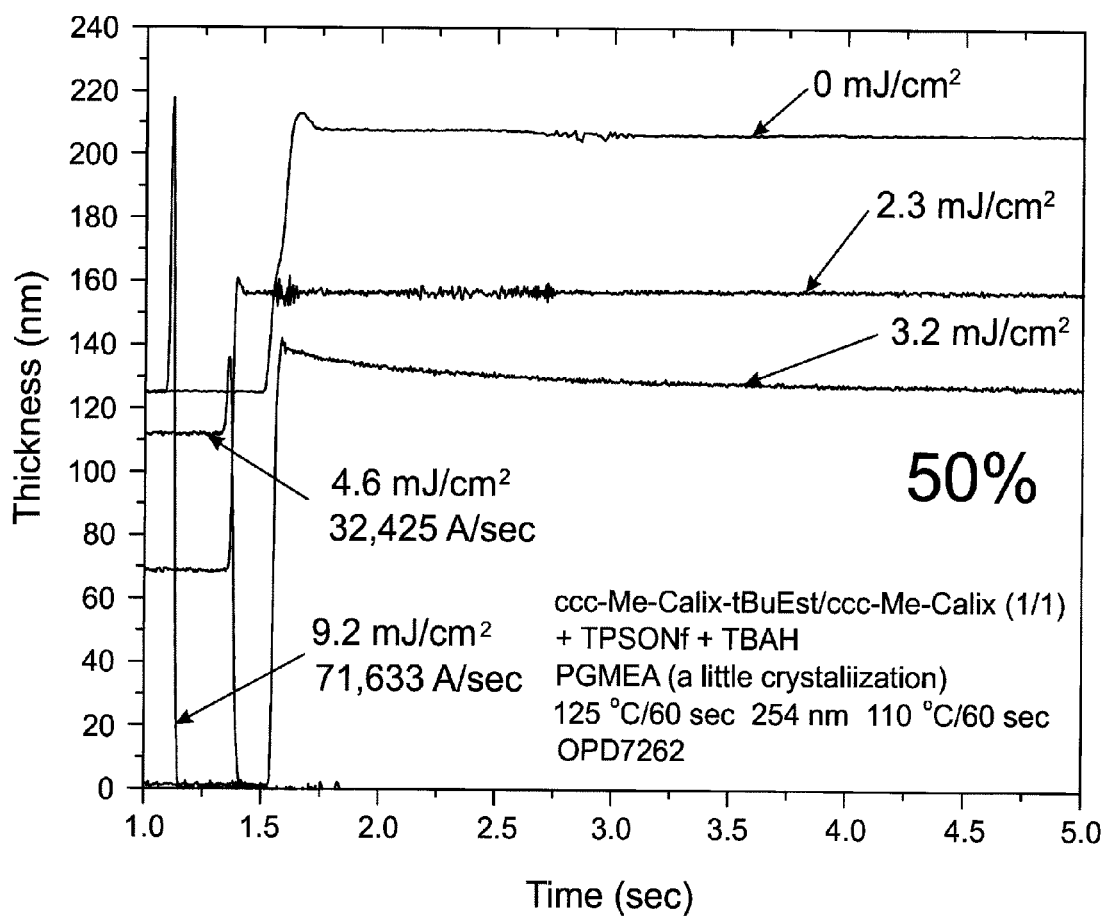
Figure 4:
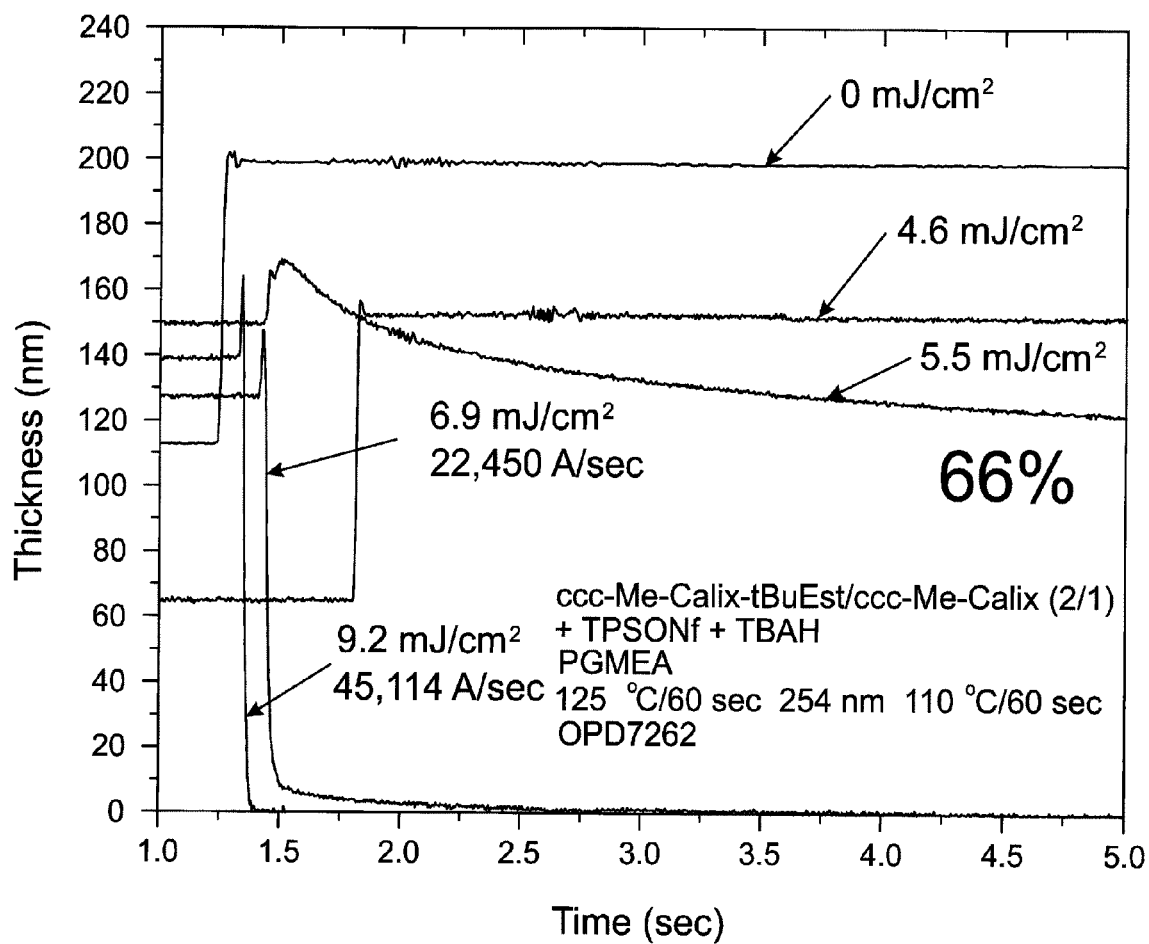

The present invention relates to high-resolution photoresist compositions for generating positive tone images on a substrate. More particularly, the photoresist compositions generally include a blend of at least one protected calixarene with at least one unprotected calixarene; a photoacid generator; and an organic solvent.

In describing and claiming the present invention, the following terminology will be used in accordance with the definitions set out below.

The term "fully protected" refers to protection of all of the phenolic hydroxyl groups in the polyphenolic calixarene structure with an acid labile group. The term "unprotected" refers to the calixarene structure without any protective groups on the phenolic hydroxyl groups.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms, and the term "lower alkyl ester" refers to an ester functionality —C(O)O—R wherein R is lower alkyl.

The term "alkenyl" as used herein refers to a branched or unbranched hydrocarbon group of 2 to 24 carbon atoms containing at least one double bond, typically containing one to six double bonds, more typically one or two double bonds, e.g., ethenyl, n-propenyl, n-butenyl, octenyl, decenyl, and the like, as well as cycloalkenyl groups such as cyclopentenyl, cyclohexenyl and the like. The term "lower alkenyl" intends an alkenyl group of two to six carbon atoms, preferably two to four carbon atoms.

The term "alkynyl" as used herein refers to a branched or unbranched hydrocarbon group of 2 to 24 carbon atoms containing at least one triple bond, e.g., ethynyl, n-propynyl, n-butynyl, octynyl, decynyl, and the like, as well as cycloalkynyl groups such as and the like. The term "lower alkynyl" intends an alkynyl group of two to six carbon atoms, preferably two to four carbon atoms.

The term "alkoxy" as used herein refers to a substituent —O—R wherein R is alkyl as defined above. The term "lower alkoxy" refers to such a group wherein R is lower alkyl.

The term "aryl" as used herein, and unless otherwise specified, refers to an aromatic moiety containing one to five aromatic rings. For aryl groups containing more than one aromatic ring, the rings may be fused or linked. Preferred monocyclic aromatic substituents are phenyl and substituted phenyl, optionally substituted with one to five, typically one to four, halo, alkyl, alkenyl, alkynyl, alkoxy, nitro or other substituents.

The term "halo" is used in its conventional sense to refer to a chloro, bromo, fluoro or iodo substituent. The terms "haloalkyl," "haloaryl" (or "halogenated alkyl" or "halogenated aryl") refers to an alkyl or aryl group, respectively, in which at least one of the hydrogen atoms in the group has been replaced with a halogen atom.

The term "alkaryl" refers to an aryl group with an alkyl substituent, wherein "aryl" and "alkyl" are as defined above.

The term "aralkyl" refers to an alkyl group that has an aryl substituent, wherein "alkyl" and "aryl" are as defined above.

The terms "photogenerated acid" and "photoacid" are used interchangeably herein to refer to the acid that is created upon exposure of the present compositions to radiation, i.e., as a result of the radiation-sensitive acid generator in the compositions.

The terms "acid-labile" or "acid-cleavable" are used interchangeably herein to refer to a molecular moiety that undergoes a change in structure upon contact with acid, e.g., an ester that, upon contact with acid, is converted to an acid, a carbonate ester that, upon contact with acid, is converted to a hydroxyl group, or the like. The groups that are "acid-labile" or "acid-cleavable" in the context of the present invention are also referred to as "acid-labile protecting groups" or simply as "acid-labile functionalities."

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

For additional information concerning terms used in the field of lithography and lithographic compositions, reference may be had to Introduction to Microlithography, Eds. Thompson et al. (Washington, D.C.: American Chemical Society, 1994).

It has been discovered that photoresist compositions that include blends of the fully-protected calixarenes and unprotected calixarenes form amorphous homogeneous glassy films and that their dissolution rates can be readily controlled by changing the ratio. While as high as 70 weight percent protection is generally required to make a partially protected calixarene insoluble in aqueous base, the blend of the at least one fully protected calixarene with the at least one unprotected calixarene becomes insoluble when the weight fraction of the fully-protected calixarene relative to the blend is greater than 40 weight percent. As will be described herein, photoresist compositions including the blend exhibit superb resolution, whereas imaging of 100% protected systems (without unprotected calixarene) suffered from poor imaging due to low glass transition temperatures and thermal flow.

In one embodiment, the calixarenes are calix[4]resorcinarenes having the structure of formula (I), wherein the various substituents are defined as follows. The various calix [4]resorcinarenes are condensation products of resorcinols and aldehydes.

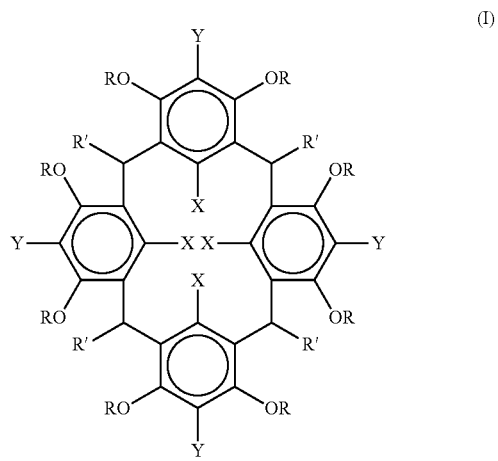

(I)

For the unprotected calix[4]resorcinarenes, the R moieties are hydrogen.

For the protected calix[4]resorcinarenes, the R moieties are acid-labile protecting groups. It will be appreciated that the symmetric location of the —OR moieties in the calix[4]resorcinarene of formula (I) corresponds to the positioning of the —OR moieties on the resorcinol starting material used to make these compounds. Suitable acid-labile protecting groups include, but are not limited to, moieties having the structure of formula (II)

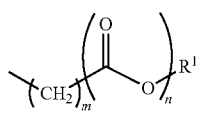

(II)

in which m is 0 or 4, n is 0 or 1, and $R^1$ is $CR^2R^3R^4$, $SiR^5R^6R^7$ or $GeR^5R^6R^7$, wherein $R^2$, $R^3$ and $R^4$ are independently hydrogen, alkyl, alkoxy, aryl, or aryloxy, typically hydrogen, lower alkyl or lower alkoxy, or are linked to form a cycloalkyl or cyclooxyalkyl ring, typically a five- to twelve-membered ring, and $R^5$, $R^6$ and $R^7$ are the same or different and are each an alkyl, typically a lower alkyl, substituent.

Thus, $R^1$ may be, for example, methoxymethyl, ethoxymethyl, methoxyethoxymethyl, benzyloxymethyl, cyclopropylmethyl, diphenylmethyl, triphenylmethyl, 1-methoxyethyl, 1,1-dimethoxyethyl, 1-ethoxyethyl, 1-ethylthio ethyl, 1,1-diethoxyethyl, 1-phenoxyethyl, 1,1-diphenoxyethyl, 1-cyclopropylethyl, 1-phenylethyl, 1,1-diphenylethyl, t-butyl, 1,1-dimethylpropyl, 1-methylbutyl, 1,1-dimethylbutyl, methylcyclopentyl, ethylcyclopentyl, methylcyclohexyl, ethylcyclohexyl, methylcyclooctyl, ethylcyclooctyl, methyladamantyl, ethyladamantyl, trimethylsilyl, ethyldimethylsilyl, diethylmethylsilyl, triethylsilyl, dimethylisopropylsilyl, t-butyldimethylsilyl, di-t-butylmethylsilyl, tri-t-butylsilyl, dimethylphenylsilyl, methyldiphenylsilyl, triphenylsilyl, trimethylgermyl, ethyldimethylgermyl, diethylmethylgermyl, triethylgermyl, dimethylisopropylgermyl, methyldiisopropylgermyl, triisopropylgermyl, t-butyldimethylgermyl, di-t-butylmethylgermyl, tri-t-butylgermyl, dimethylphenylgermyl, methyldiphenylgermyl, triphenylgermyl, and the like. Other suitable acid-labile protecting groups may be found in the pertinent literature and texts (e.g., Greene et al., Protective Groups in Organic Synthesis, $2^{nd}$ Ed. (New York: John Wiley & Sons, 1991).

Representative —OR moieties are illustrated in formulas (III)-(VIII) below.

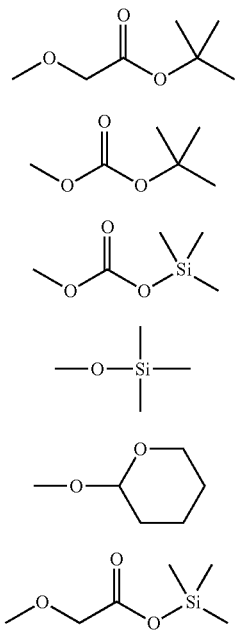

The R' moieties are independently selected from the group consisting of hydrogen, alkyl, aryl, and alkaryl. When an R' is alkyl, aryl or alkaryl, it may be substituted with one to four substituents selected from the group consisting of hydroxy, halogen, lower alkyl, lower alkoxy and nitro. Examples of particularly preferred R' groups include, but are not limited to, hydrogen, $C_1$-$C_{12}$ alkyl, and $C_1$-$C_{12}$ alkyl substituted with a terminal hydroxyl group, a halogen atom, particularly bromo, a phenyl ring, or a phenyl ring bearing a hydroxy, halogen or lower alkyl substituent.

The X and Y moieties may be the same or different and are selected from the group consisting of hydrogen, alkyl, alkenyl, alkynyl, alkoxy, aryl, aralkyl, alkaryl, halo, cyano, nitro and carboxylate. In certain embodiments, the X moieties are all hydrogen, and the Y moieties are selected from the group consisting of hydrogen and lower alkyl.

The basic calix[4]resorcinarene molecule can exist in either of two isomeric forms, commonly referred to as the $C_{2V}$ and the $C_{4V}$ configurations (also sometimes referred to herein as the "ctt" and "ccc" isomers, respectively). These isomers can be separated by fractional crystallization using conventional techniques. In the context of the invention, the fully protected and unprotected calix[4]resorcinarenes may be in either the $C_{2V}$ or the $C_{4V}$ configurations so as to provide structural monomodality. That is, the calixarene blend in the photoresist composition is a blend of an isomerically pure protected calixarene and an isomerically pure unprotected calixarene. Alternatively, a mixture of isomers can be used in the blend.

The unprotected calix[4]resorcinarenes can generally be prepared by condensation reaction with resorcinol and an aldehyde using hydrochloric acid as a catalyst in accordance with the following scheme.

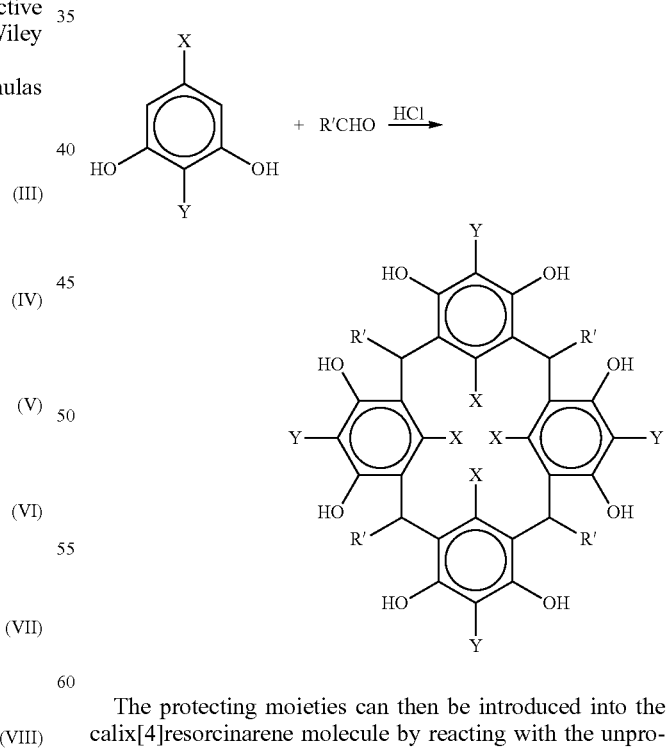

The protecting moieties can then be introduced into the calix[4]resorcinarene molecule by reacting with the unprotected calix[4]resorcinarene with a desired moiety that will then provide an acid-labile functionality on the eight hydroxyl groups. The reaction may be conducted using conventional means known to those skilled in the art. For example, to provide a calix[4]resorcinarene fully protected with the t-butoxycarbonylmethyl (t-BuOOCCH$_2$) group, the unprotected calix[4]resorcinarene may be reacted with eight equivalents or a slight excess of t-butyl bromoacetate and potassium carbonate. Similarly, to provide a calix[4]resorcinarene fully protected with the t-butoxycarbonyl (tBuOOC) group, the unprotected calix[4]resorcinarene may be reacted with eight equivalents or a slight excess of di-t-butyl dicarbonate. Various reaction schemes to fabricate the calix[4]resorcinarenes are known in the art and are not intended to be limited to that shown above. By way of example, the calix[4]resorcinarenes can be prepared in accordance with Ito et al., Characterization and Lithographic Application of Calix[4]resorcinarene Derivatives, Chem. Mater. 20: 341-356 (2008).

The at least one fully protected and/or the at least one unprotected calix[4]resorcinarene can have a calixarene structure selected from the group consisting of C-tetramethyl-calix[4]resorcinarene, C-tetraphenyl-calix[4]resorcinarene, and C-isopropylphenyl-calix[4]resorcinarene.

The photoresist resist compositions herein include at least one fully protected calix[4]resorcinarenes and at least one unprotected calix[4]resorcinarenes, a photoacid generator, and a solvent.

In one embodiment, the protected calix[4]resorcinarenes present in the blend is 25 to 90 mol %. In another embodiment, the protected calix[4]resorcinarenes is present in the blend at a mol ratio of 33 to 75 mol %. In still another embodiment, the protected calix[4]resorcinarenes is present in the blend at a mol ratio of 40 to 60 mol %.

When the protection level is 25-33 mol %, a small amount of the unexposed film dissolved in 0.26 N tetramethyl ammonium hydroxide (TMAH) aqueous developer but when the concentration of the fully-protected compound was above 40 mol %, there is no thinning of the unexposed film in the aqueous base developer. This is in sharp contrast with photoresists formulated with partially protected calix[4]resorcinarenes in which a protection level below 35% resulted in relatively faster dissolution of >3,000 nanometer per second (nm/sec) in the same aqueous base developer, which is essentially the same as the unprotected calix[4]resorcinarenes. Moreover, at 50% partial protection, dissolution was found to be about 2,000 nm/sec. As much as 70% partial protection was required to render the unexposed film insoluble in 0.26 N TMAH in the case of the partial protection approach, which is less advantageous than the blend approach of the present invention as thinning that occurs upon post exposure baking is excessively large.

Upon exposure to radiation, the photoacid generator generates an acid that is used to cleave the acid labile groups. A variety of photoacid generators (also referred to herein as "PAGs") can be used in the composition of the present invention. Generally, suitable acid generators have a high thermal stability (preferably to temperatures greater than 140° C.) so they are not degraded during pre-exposure processing. Any suitable photoacid generator can be used in the photoresist compositions of the invention. Typical photoacid generators include, without limitation: sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoro arsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethyl-phenyldiphenylsulfonium benzenesulfonate, tris(t-butylphenyl)sulfonium perfluorooctanesulfonate, diphenylethylsulfonium chloride, and phenacyldimethylsulfonium chloride; halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoro arsenate, diphenyliodonium bis(t-butylphenyl) triflate, and bis-(di-t-butylphenyl)-iodonium camphanylsulfonate; α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane; trifluoromethanesulfonate esters of imides and hydroxyimides, e.g., α-(trifluoromethylsulfonyloxy)-bicyclo[2.2.1] hept-5-ene-2,3-dicarboximide (MDT); nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzenesulfonate; sulfonyloxynaphthalimides such as N-camphorsulfonyloxynaphthalimide and N-pentafluorophenylsulfonyloxyna-phthalimide; pyrogallol derivatives (e.g., trimesylate of pyrogallol); naphthoquinone-4-diazides; alkyl disulfones; s-triazine derivatives, as described in U.S. Pat. No. 4,189,323; and miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecanesulfonate (DDSN), and benzoin tosylate.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

The photoresist composition herein preferably comprises approximately 0.5-10 wt. % of the photoacid generator, and up to about 94.5 wt. % of the unprotected and fully protected calix[4]resorcinarenes.

Other customary additives may also be present in the photoresist composition, including pigments, sensitizers, preservatives, acid-diffusion controlling agents, coating aids such as surfactants or anti-foaming agents, adhesion promoters, plasticizers, and dissolution inhibitors, surface modifying agents, among others. Typically, the sum of all customary additives will comprise less than 20 percent of the solids included in the resist formulation, preferably, less than 5 percent.

Pigments may be used to adjust the optical density of the formulated resist and sensitizer, which can enhance the activity of photoacid generators by absorbing radiation and transferring it to the photoacid generator. Examples include aromatics such as functionalized benzenes, pyridines, pyrimidines, biphenylenes, indenes, naphthalenes, coumarins, anthraquinones, and other aromatic ketones.

A wide variety of compounds with varying basicity may be used as preservatives and acid-diffusion controlling additives. They may include nitrogenous compounds such as aliphatic primary, secondary, and tertiary amines, cyclic amines such as piperidines, morpholines, aromatic heterocycles such as pyridines, pyrimidines, purines, imines such as diazabicycloundecene (DBU), guanidines, imides, amides, and others. Ammonium salts of basic anions may also be used, including ammonium, primary, secondary, tertiary, and quaternary alkyl- and arylammonium salts of alkoxides, hydroxides, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

The remainder of the photoresist composition is composed of a solvent. The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Introduction to Microlithography, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, and mixtures of ethyl lactate and ethyl 3-ethoxyproprionate. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50% of the total mass of the resist formulation is typically composed of the solvent, preferably greater than 80%.

The present invention also relates to a process for generating a resist image on a substrate comprising the steps of: (a) coating a substrate with a film comprising the resist composition of the invention; (b) imagewise exposing the film to radiation; and (c) developing the image. The first step involves coating the substrate with a film comprising the resist composition dissolved in a suitable solvent. Suitable substrates are silicon-containing, and include, for example, silicon dioxide, silicon nitride, silicon oxynitride, and chrome-coated quartz or glass. The substrate may or may not be coated with an organic anti-reflective layer prior to deposition of the resist composition. Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to a temperature of about 25-150° C. for a short period of time, typically on the order of about 1 minute. The dried film has a thickness of about 20-5000 nm, preferably about 50-1200 nm.

In the second step of the process, the film is imagewise exposed to x-ray, electron beam (e-beam), ultraviolet radiation or extreme ultraviolet (EUV) radiation (13.4 nm). The radiation is absorbed by the radiation-sensitive acid generator to generate free acid, which with heating causes cleavage of the acid-cleavable ester substituent and formation of the corresponding acid. Preferably, after the film has been exposed to radiation, the film is again heated to a temperature of about 25-150° C. for a short period of time, on the order of about 1 minute.

The third step involves development of the image with a suitable solvent. Suitable solvents include an aqueous base, preferably an aqueous base without metal ions such as the industry standard developer tetramethyl ammonium hydroxide or choline. The resist composition of the invention has high radiation sensitivity and provides positive images with high contrast and straight walls. The composition can also be readily developed in industry standard developer. Development is without unacceptable thinning or swelling. The resist has suitable thermal properties ($T_g$), good adhesion, and planarization. Simply varying the ratio of the fully protected calixarene to the unprotected calixarene can vary the solubility characteristics of the composition of the present invention.

The composition of the present invention may be used to make an integrated circuit assembly, such as an integrated circuit chip, multichip module, circuit board, quartz mask, or imprint template. The integrated circuit assembly comprises a circuit formed on a substrate by the steps of (a) coating a substrate with a film comprising the resist composition of the present invention, (b) imagewise exposing the film to radiation to form a latent image therein, (c) developing the image to expose the substrate, and (d) forming the circuit in the developed film on the substrate by art-known techniques. After the substrate has been exposed, circuit patterns can be formed in the exposed areas by coating the substrate with a conductive material such as conductive metals by art-known dry techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p-doped or n-doped circuit transistors. Other means for forming circuits are well known to those skilled in the art. The composition of the present invention may also be used to fabricate photomasks, imprint templates and the like.

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

EXAMPLES

Example 1

In this example, dissolution rates were measured for various photoresist compositions that included varying blends of fully protected to unprotected calixarene. The dissolution rates were measured in 0.26 N TMAH using a quartz crystal microbalance. The photoresists were formulated by dissolving a blend of the fully protected and unprotected calixarenes, PAG (triphenylsulfonium nonaflate, TPSONf, 5 wt % to calixarene) and tetrabutylammonium hydroxide (TBAH, 5 wt % to PAG) in a casting solvent (propylene glycol methyl ether acetate, PGMEA, primarily). The molecular glass resists consisted of a blend of two structurally monomodal compounds: unprotected (ccc) C-tetramethyl-calix[4]resorcinarene and t-butoxycarbonylmethyl fully protected (ccc) C-tetramethyl-calix[4]resorcinarene.

FIGS. 1-4 illustrate the dissolution kinetics curves of the photoresist compositions. When the protection level was 33 mol % (i.e., the ratio of fully protected t-butoxycarbonylmethyl (ccc) C-tetramethyl-calix[4]resorcinarene to unprotected (ccc) C-tetramethyl-calix[4]resorcinarenes was 1:2), a relatively small amount of the unexposed film dissolved in the aqueous base developer but when the concentration of the fully-protected compound was increased to 40 mol %, no thinning of the unexposed film in the aqueous base developer was observed. This is in sharp contrast with t-butoxycarbonyl partially protected calixarene formulated photoresists, in which a protection level below 35% resulted in dissolution of >3,000 nm/sec as shown in Table 1, which is essentially the same as an unprotected calixarene compound. Increasing partial protection to 50% also dissolved very fast at about 2,000 nm/sec. It was only at a protection level of 70% that dissolution did not occur by the aqueous TMAH developer. It should be noted that the photoresist containing the t-butoxycarbonyl partially protected C-tetramethyl-calix[4]resorcinarene was formulated similarly to the photoresist including the calixarene blend as previously described.

TABLE 1

| Level of Partial Protection | Dissolution Rate in 0.26N TMAH (nm/sec) |
|---|---|
| 35% | >3000 |
| 50% | 2,000 |
| 70% | 0 |

As demonstrated, 70% partial protection is required to render the unexposed film insoluble in 0.26 N TMAH in the case of the partial protection approach, which is less advantageous than the blend approach of the presented invention as thinning that occurs upon PEB is excessively large. The inventive photoresists with the blend of fully t-butoxycarbonylmethyl protected and unprotected C-tetramethyl-calix[4]resorcinarenes exhibited very high dissolution swings with an excellent Rmax.

Figure 5:
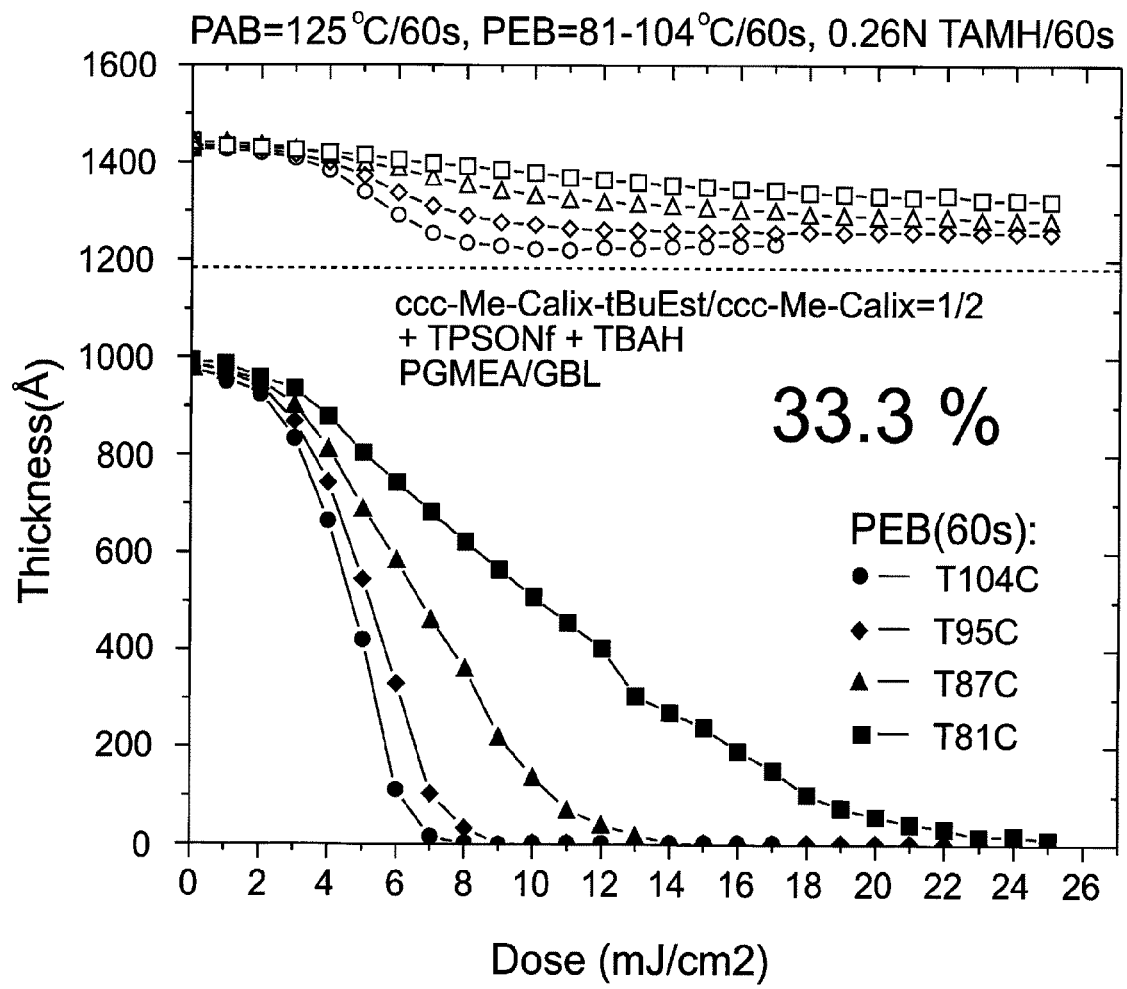
FIGS. 5-7 graphically illustrate contrast curves at 248 nm as a function of post exposure bake temperature for blend molecular glass resists with a varying ratio of fully t-butoxycarbonylmethyl-protected to unprotected (ccc) C-tetramethyl-calix[4]resorcinarenes in 0.26 N TMAH.
Figure 6:
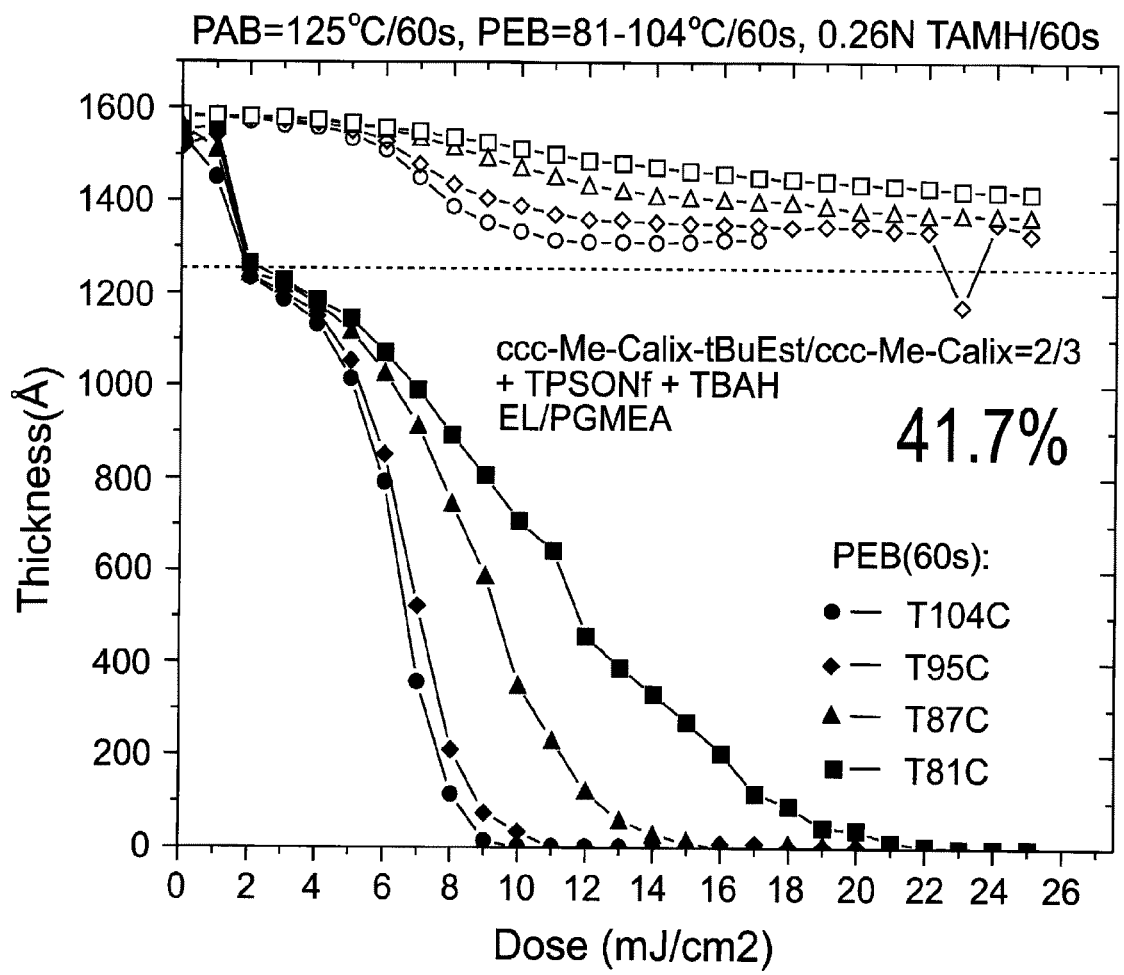
Figure 7:
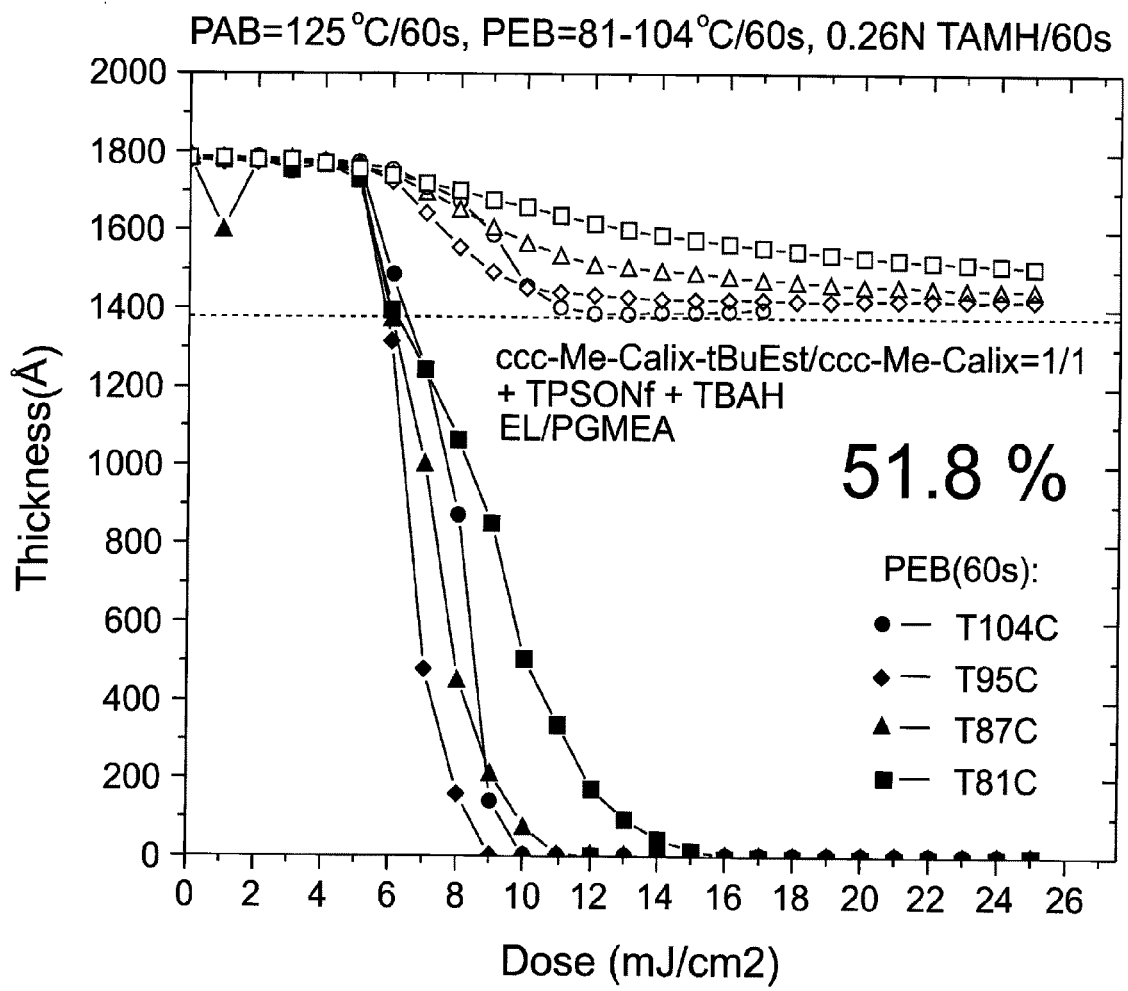
Figure 8A:
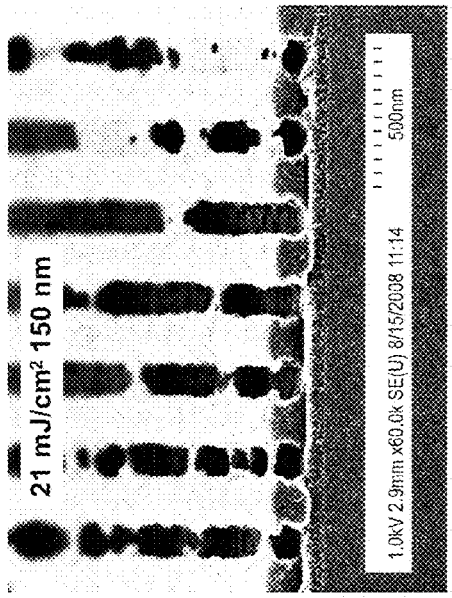
FIG. 8 pictorially illustrates scanning electron micrographs of 1:1 line space patterns printed from molecular glass photoresists including the blended calixarenes on a 248 nm ASML stepper (0.63 NA, annular illumination).
Figure 8B:
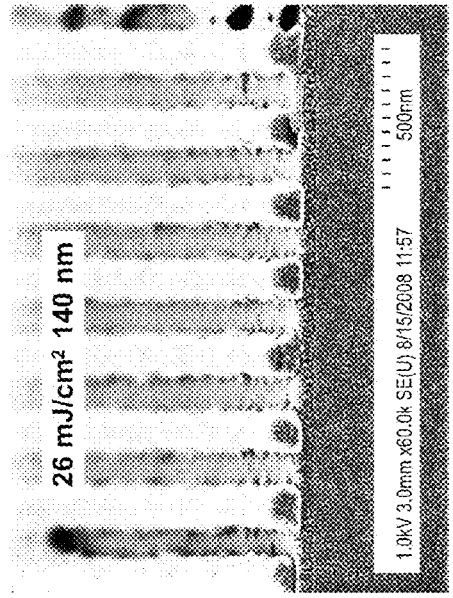
Figure 8C:
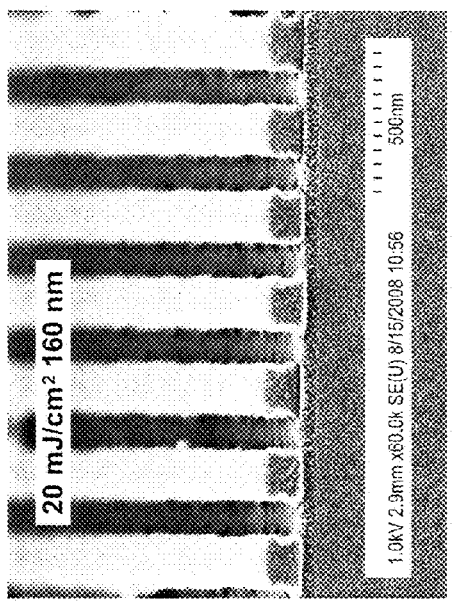
Figure 8D:
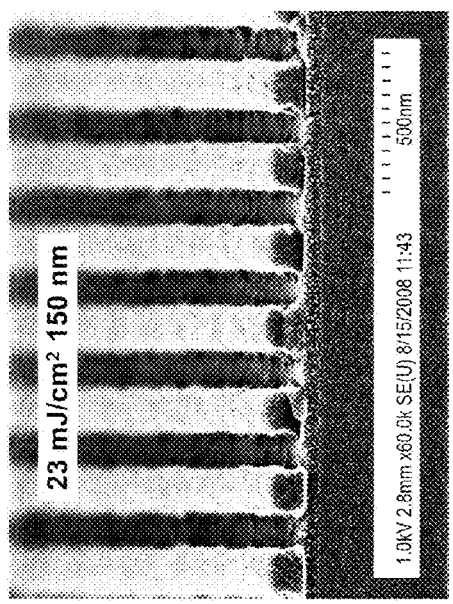
Figure 9A:
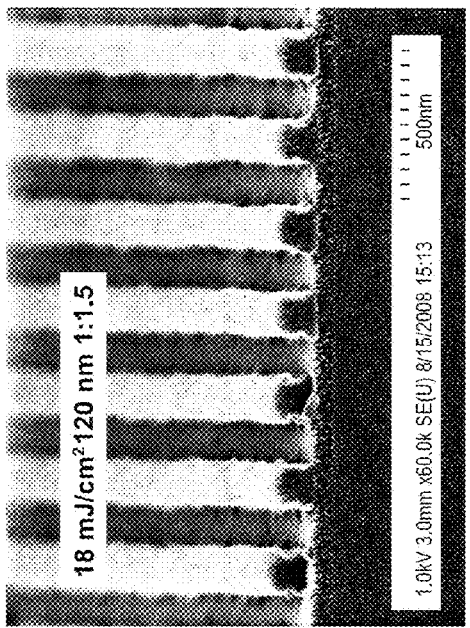
FIG. 9 pictorially illustrates scanning electron micrographs of 1:1.5 line space patterns printed from molecular glass photoresists including the blended calixarenes on a 248 nm ASML stepper (0.63 NA, annular illumination).
Figure 9B:
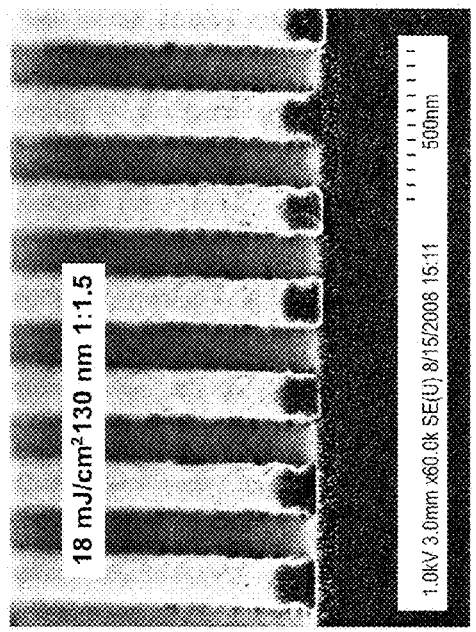
Figure 9C:
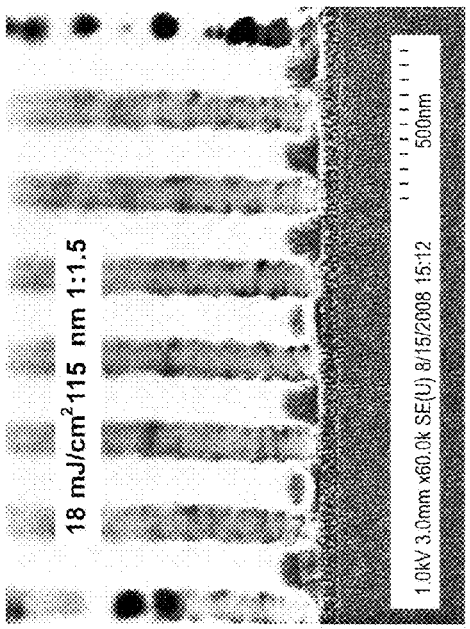
Figure 9D:
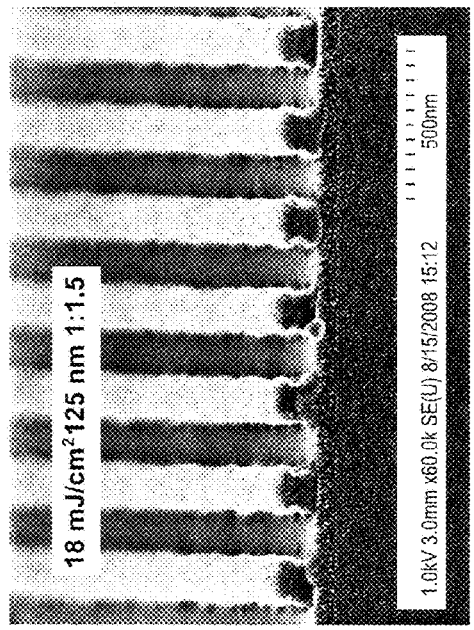

In FIGS. 5-7, contrast curves at 248 nm as a function of post exposure bake temperatures were generated from the photoresists that included the varying blends of fully protected (t-butoxycarbonylmethyl) to unprotected (ccc) C-tetramethyl-calix[4]resorcinarenes using an ASML stepper. The resists exhibited good contrast when baked at 87° C. and higher.

Figure 10A:
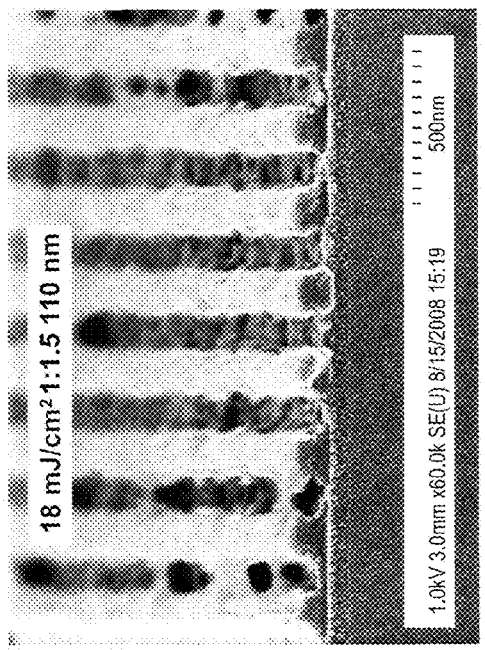
FIG. 10 pictorially illustrates scanning electron micrographs detailing resolution capability of molecular glass photoresists including the blended calixarenes on a 248 nm ASML stepper (0.63 NA, annular illumination).
Figure 10B:
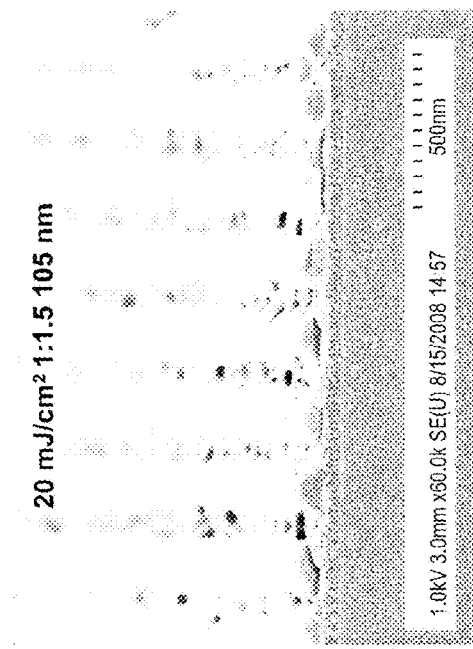
Figure 10C:
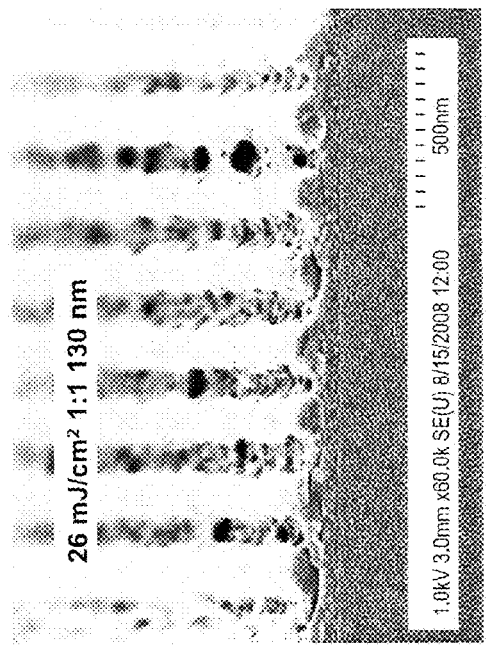

Scanning electron micrographs (SEM) of 1:1 line/space patterns printed in the 1:1 blended resists based on t-butoxycarbonylmethyl protection on an ASML 248 nm stepper are presented in FIG. 8. The resist exhibited excellent resolution, printing 140 nm 1:1 line/space patterns at 248 nm without phase shifting. In the case of 1:1.5 line/space patterns as shown in FIG. 9, lines of 115 nm and greater are cleanly printed at the same dose. Furthermore, the resist resolved 105 nm 1:1.5 and 130 nm 1:1 line/space patterns at 248 nm as shown in FIG. 10 although the modulation transfer function of such small features was nonexistent at 248 nm.

Figure 11:
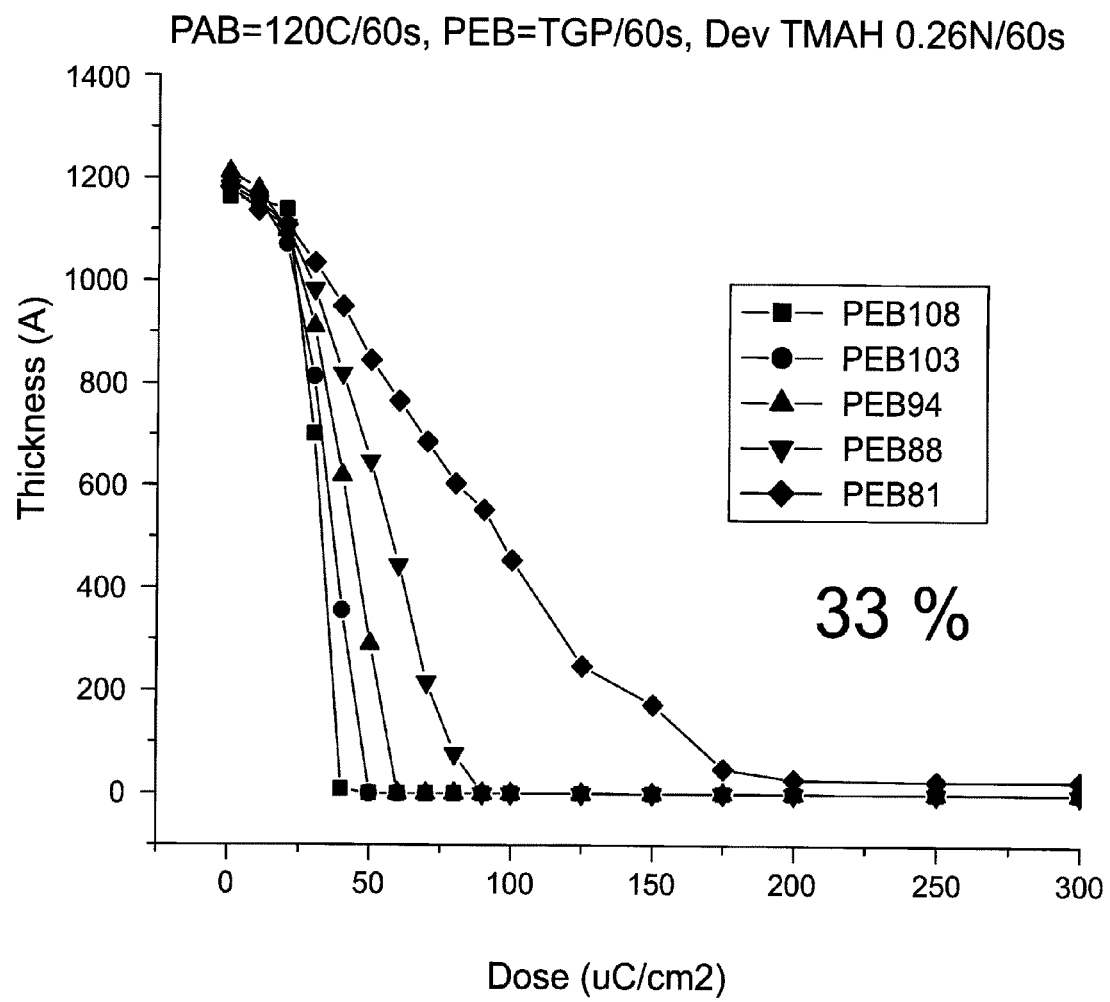
FIGS. 11-13 graphically illustrate e-beam contrast curves as a function of post exposure bake temperature of blend molecular glass resists with a varying ratio of fully t-butoxycarbonylmethyl-protected to unprotected (ccc) C-tetramethyl-calix[4]resorcinarenes in 0.26 N TMAH.
Figure 12:
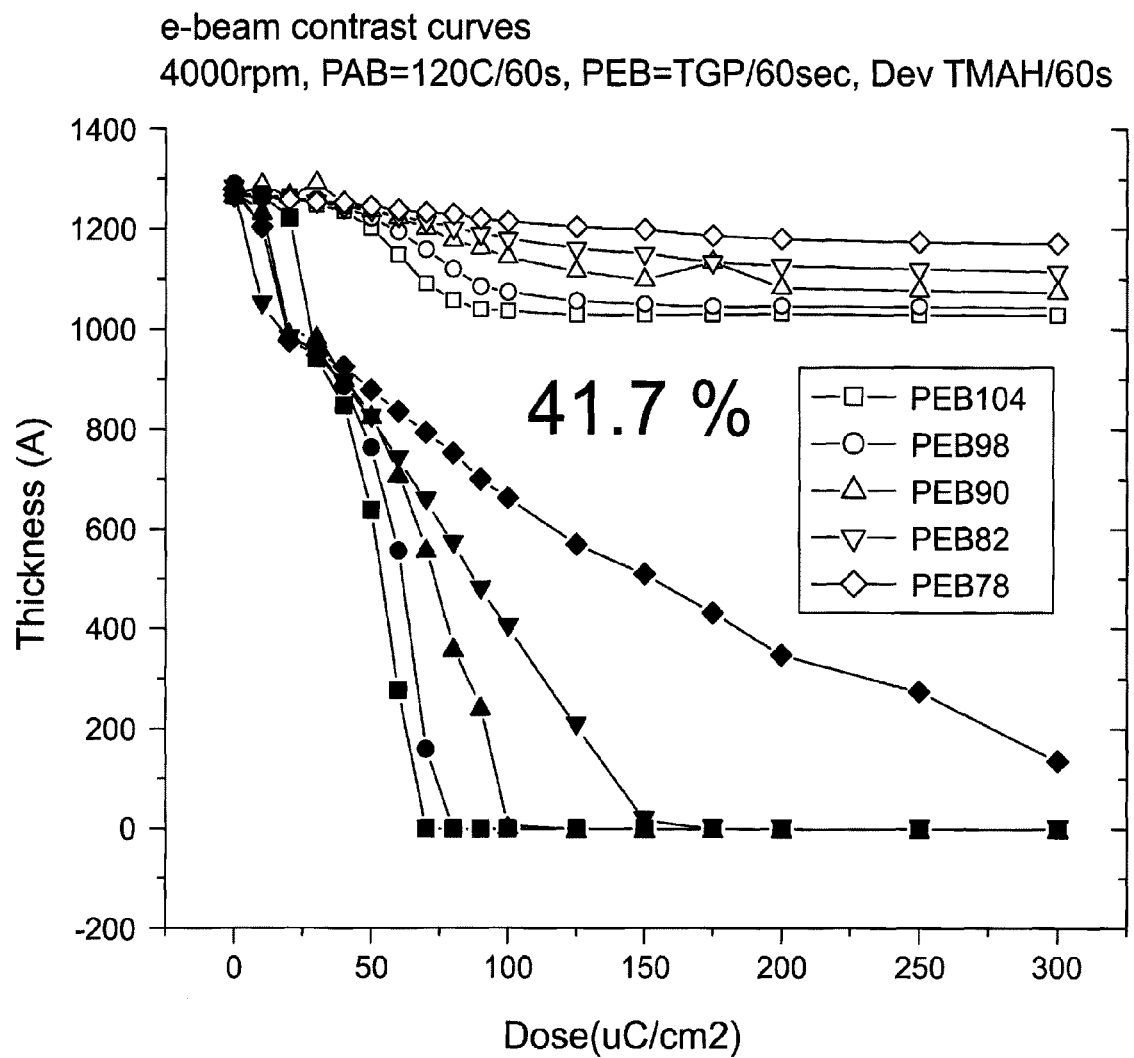
Figure 13:
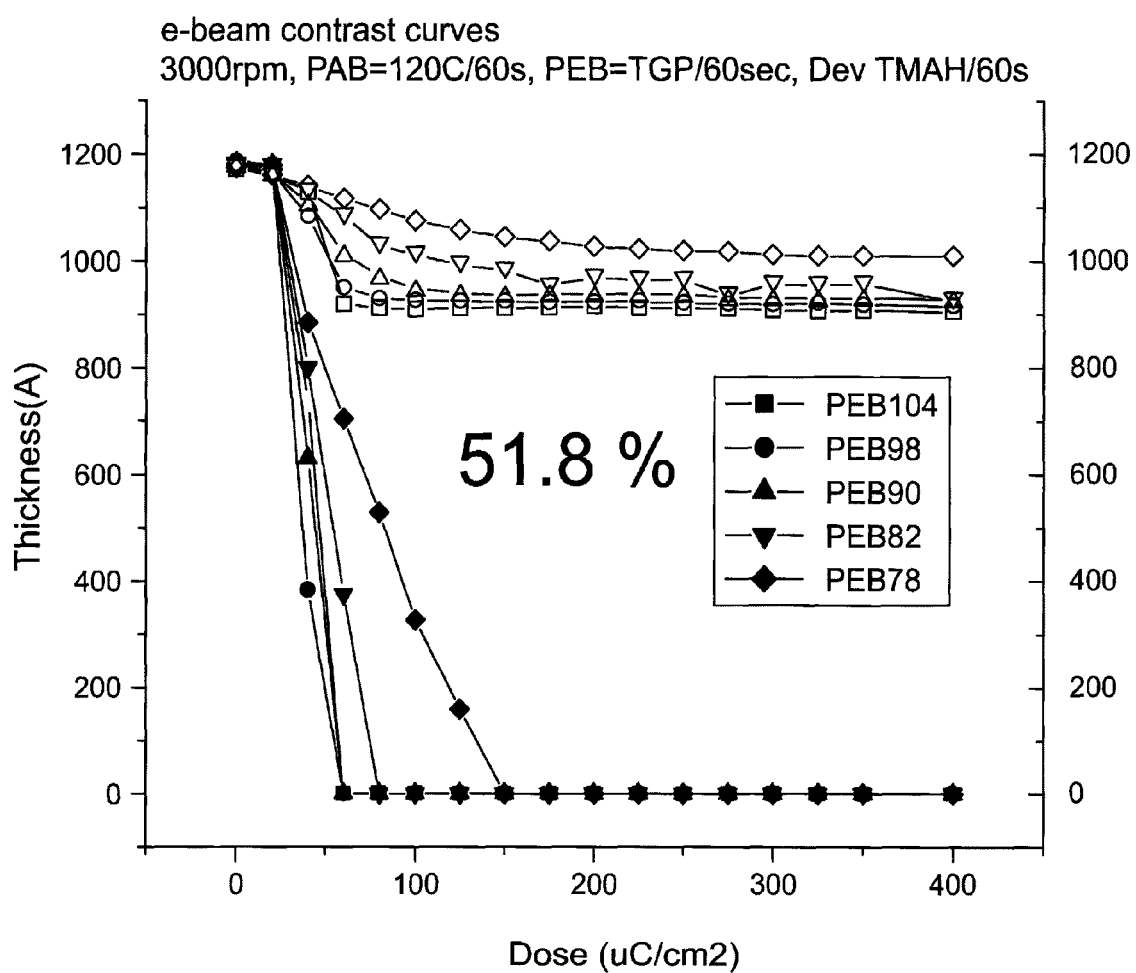
Figure 14B:
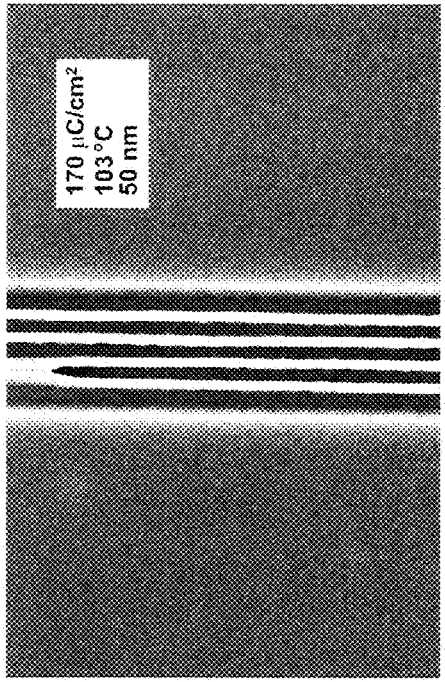
FIG. 14 (A-D) pictorially illustrates scanning electron micrographs of 1:1 line space patterns printed from a molecular glass photoresist including 33 weight percent of fully t-butoxycarbonylmethyl-protected (ccc) C-tetramethyl-calix[4]resorcinarenes by 100 KeV e-beam.
Figure 14D:
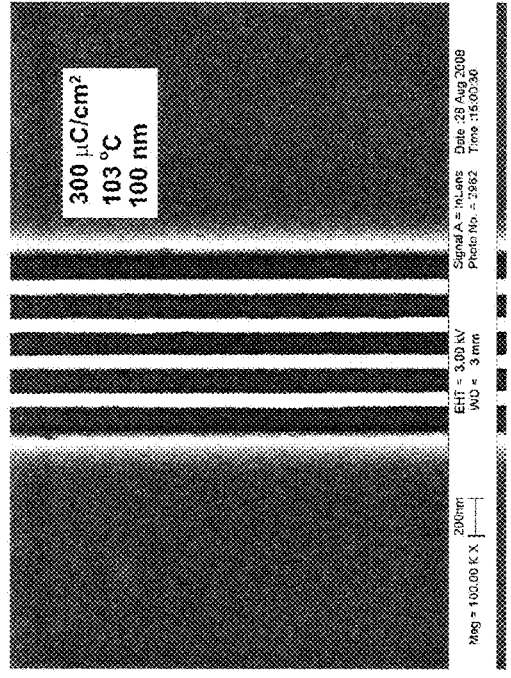
Figure 14A:
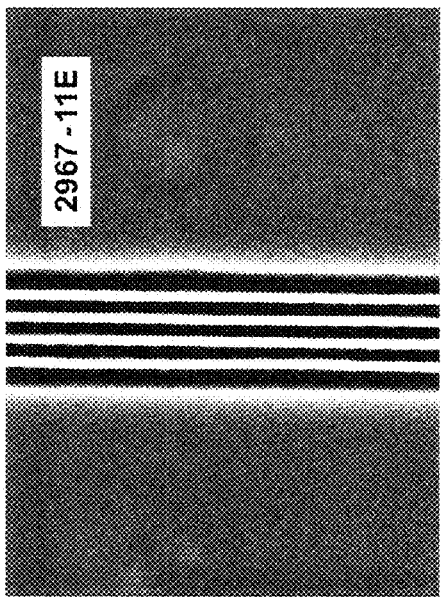
Figure 14C:
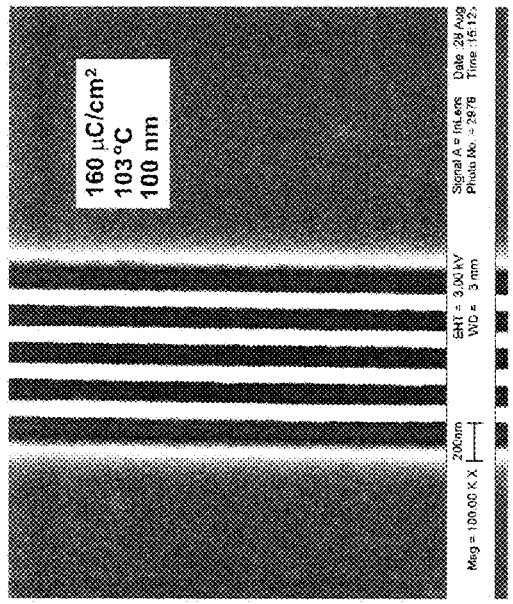
Figure 15B:
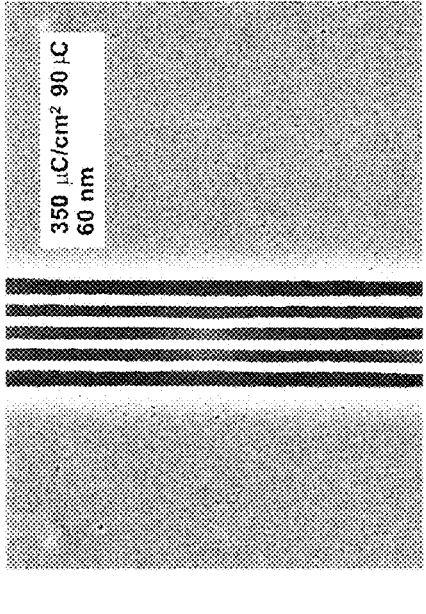
FIG. 15 (A-D) pictorially illustrates scanning electron micrographs of 1:1 line space patterns printed from a molecular glass photoresist including 42 weight percent of fully t-butoxycarbonylmethyl-protected (ccc) C-tetramethyl-calix[4]resorcinarenes by 100 KeV e-beam.
Figure 15D:
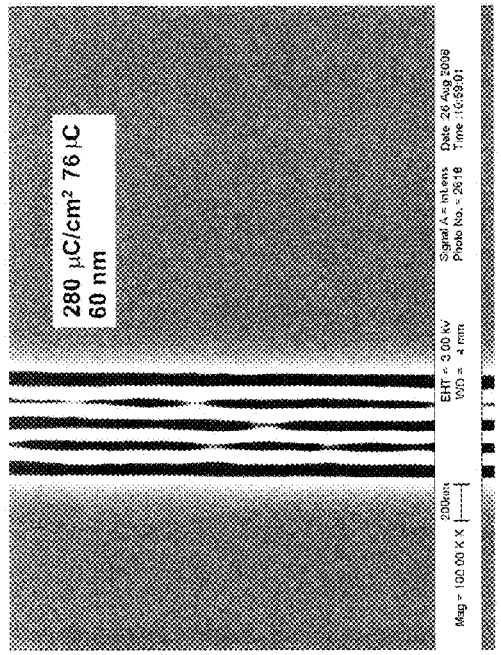
Figure 15A:
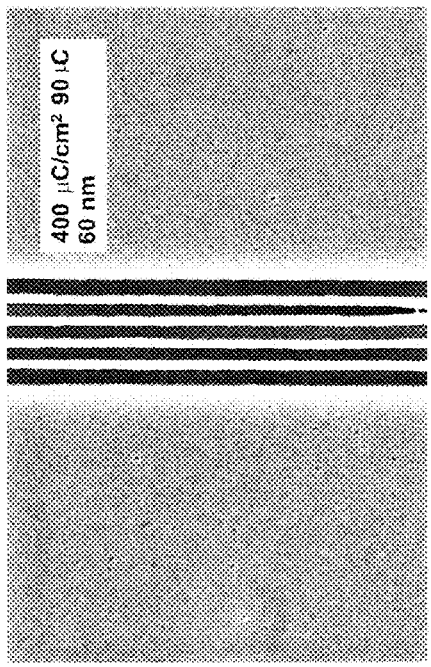
Figure 15C:
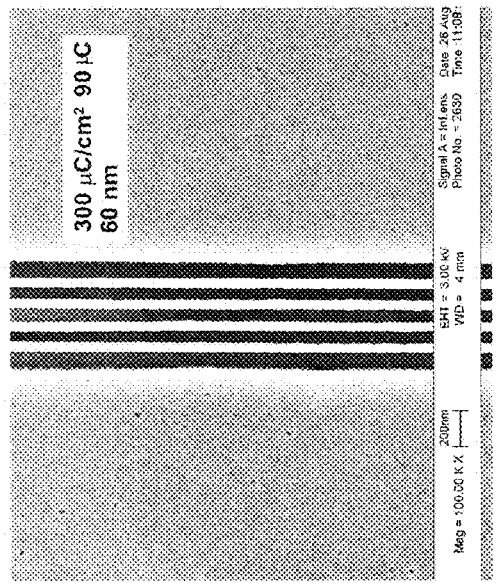

In FIGS. 11-13, e-beam contrast curves generated using a 100 keV Leica system are presented as a function of post exposure bake temperature. In contrast to photoresists including partially protected calixarenes, the blended photoresists exhibited excellent contrast for a wider range of protection (33 to 51.8 mol % fully protected calixarene to unprotected calixarene). FIG. 14 (A-D) provides top down scanning electron micrographs of positive images of equal line/space patterns printed by 100 keV e-beam irradiation of a photoresist including 33 mol % t-butoxycarbonylmethyl protected (ccc) C-tetramethyl-calix[4]resorcinarene in the blend. In FIG. 14A, 60 nm line/space patterns are resolved and in FIG. 14B, 50 nm 1:1 line/space resolution was obtained. As shown in FIGS. 14C and 14D, a wide exposure does latitude from 160 microcoulombs per square centimeter (uC/cm$^2$) to 300 uC/cm$^2$ for 100 nm 1:1 line/space patterns was obtained.

Figure 17A:
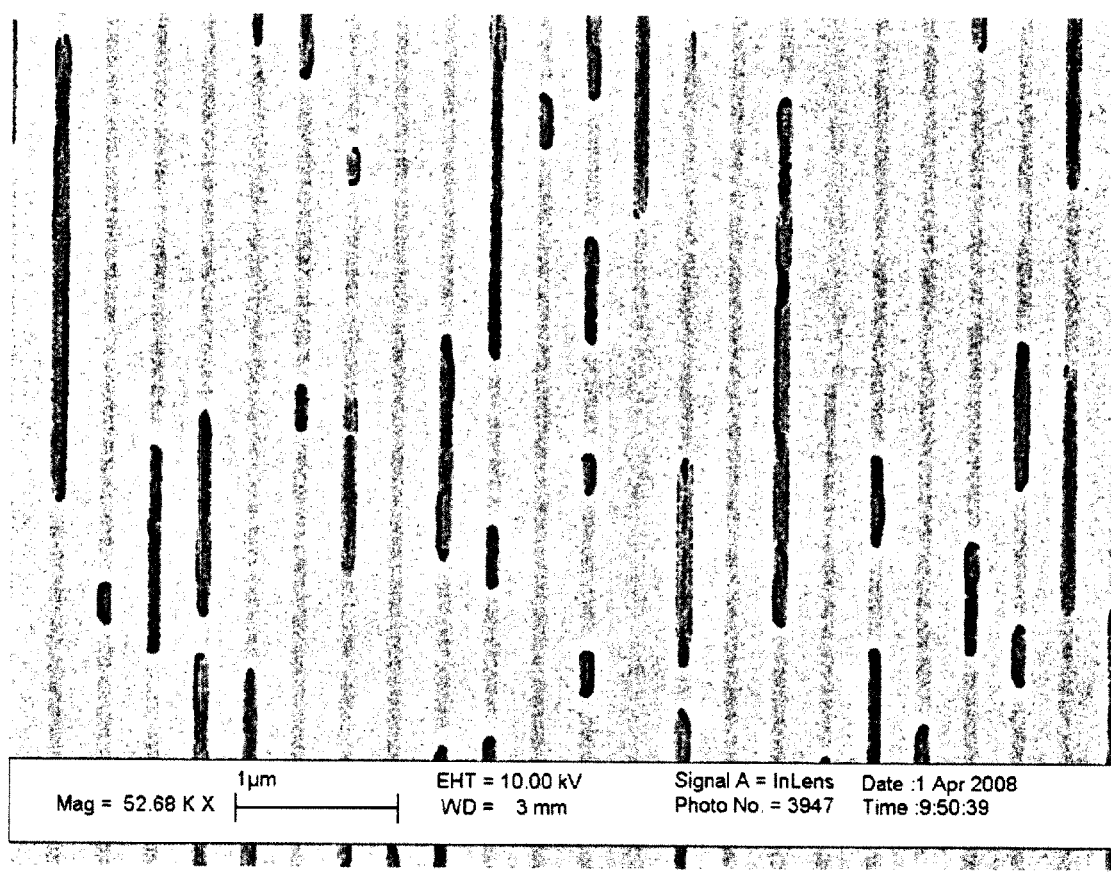
FIG. 17 (A-B) pictorially illustrates scanning electron micrographs of 1:1 line space patterns printed from a molecular glass photoresist including 70% partial t-butoxycarbonyl protection of (ccc) C-tetramethyl-calix[4]resorcinarenes by 100 KeV e-beam.
Figure 17B:
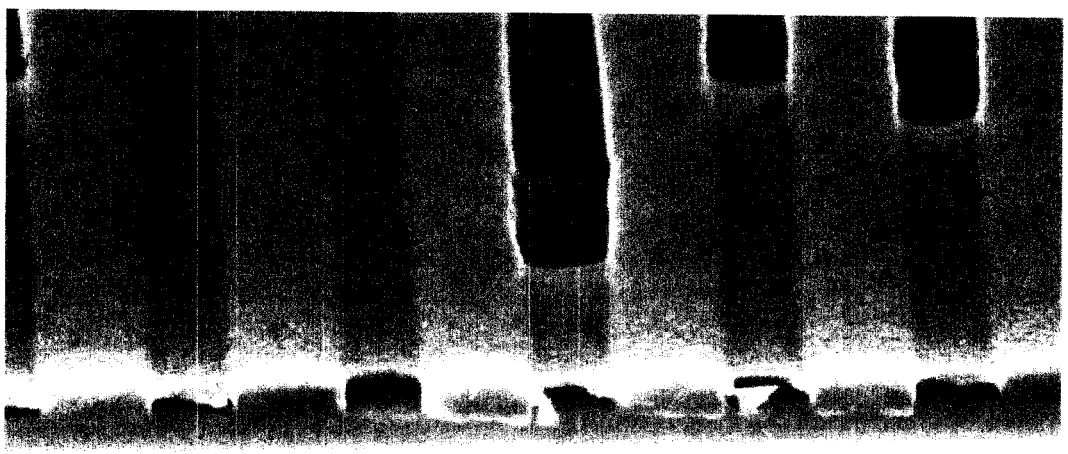

In FIG. 15 (A-D), top-down scanning electron micrographs of 1:1 line/space patterns printed in a photoresist containing 42 mol % of t-butoxycarbonylmethyl protected calixarene in the blend. A large exposure latitude was observed in the 60 nm patterning (300-400 μC/cm$^2$). It is noteworthy that 60 nm features are printed even when the blend resist was baked at a low temperature of 76° C. as shown in FIG. 15 D in spite of the high activation energy of the protecting group. FIG. 16 (A-E) pictorially illustrates cross-sectional scanning electron micrographs of 1:1 line space patterns printed from a molecular glass photoresist including 33 weight percent of fully t-butoxycarbonylmethyl-protected (ccc) C-tetramethyl-calix[4]resorcinarenes by 100 KeV e-beam. Again, high resolution was obtained as evidenced by the 50 nanometer resolution. In contrast, partially-protected calixarene resists generally suffered from massive skin formation in e-beam imaging as shown in FIG. 17 (A-B) in which a photoresist formulation patterned using e-beam was prepared in accordance with Example 1 included a 70% partially protected (ccc) calix[4]resorcinarene. Advantageously, the blended systems as described in the present application are essentially devoid of such a problem.

Example 2

In this example, dissolution rates were measured of various photoresists that included varying blends of fully protected (t-butoxycarbonyl) to unprotected (ccc) C-tetramethyl-calix[4]resorcinarenes. The dissolution rates were measured in 0.26 N TMAH using a quartz crystal microbalance. The photoresists were formulated by dissolving a blend of fully protected and unprotected calixarenes, TPSONf, 5 wt %, and TBAH, 5 wt % in primarily PGMEA casting solvent. The molecular glass resist consisted of two structurally monomodal compounds: unprotected C-tetramethyl-calix[4]resorcinarene and fully protected butoxycarbonyl (ccc) C-tetramethyl-calix[4]resorcinarene.

Figure 18:
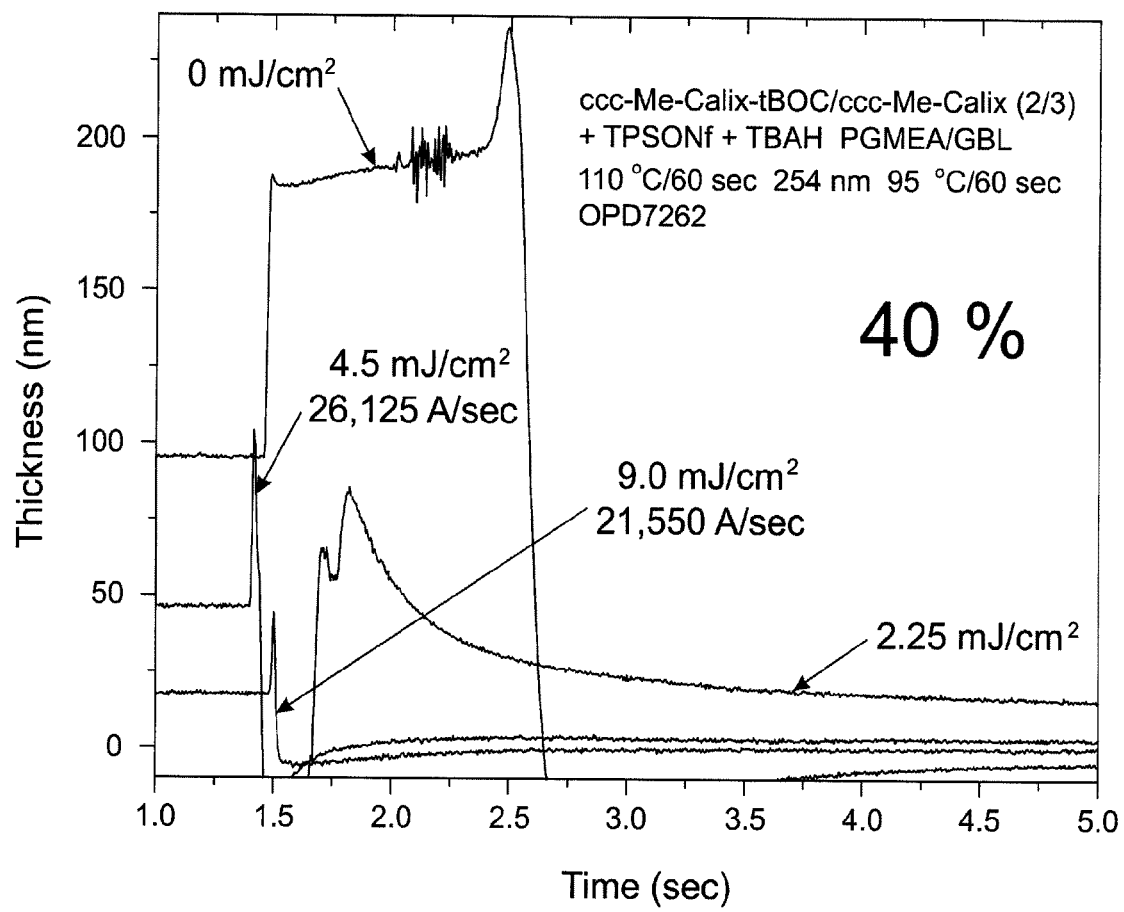
FIGS. 18-20 graphically illustrate dissolution kinetics curves of molecular glass resists with a varying weight % of fully t-butoxycarbonyl protected to unprotected C-tetramethyl-calix[4]resorcinarenes in 0.26 N TMAH.
Figure 19:
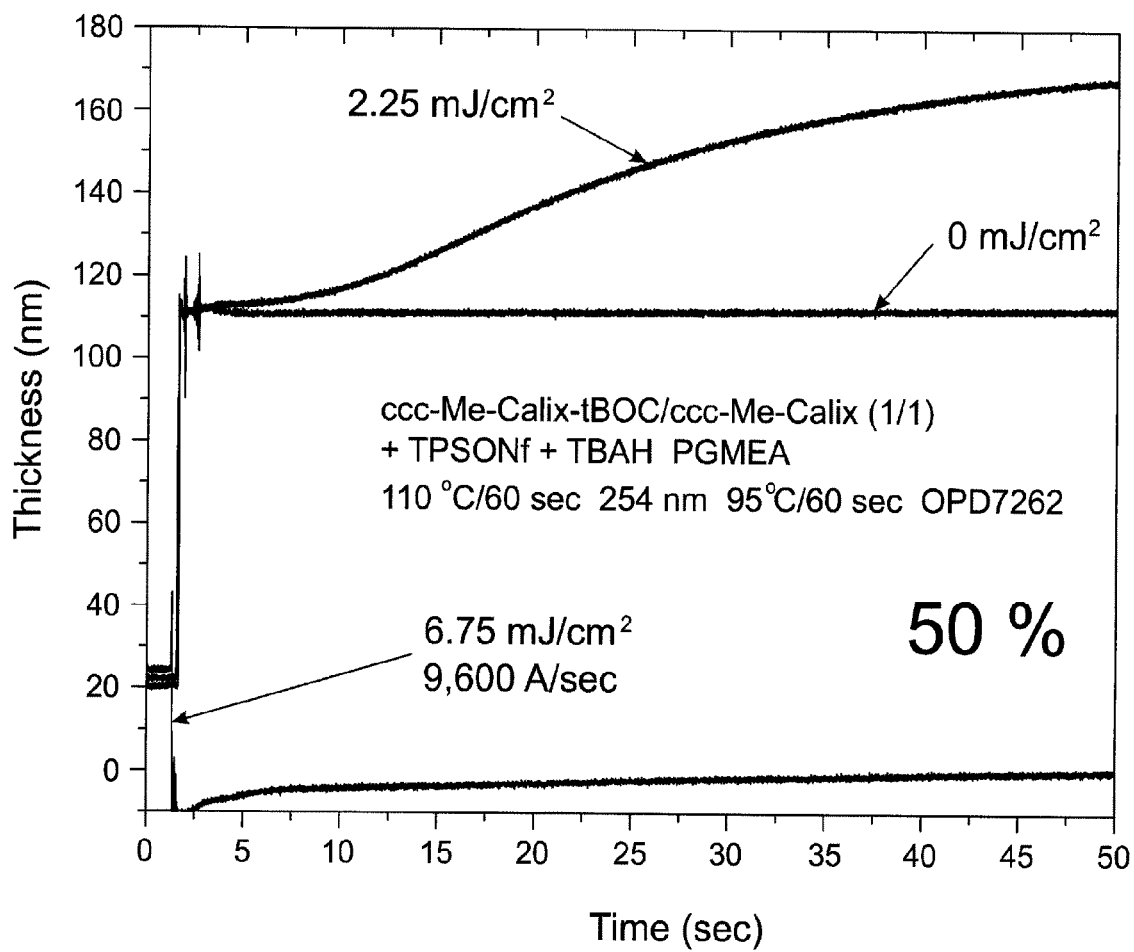
Figure 20:
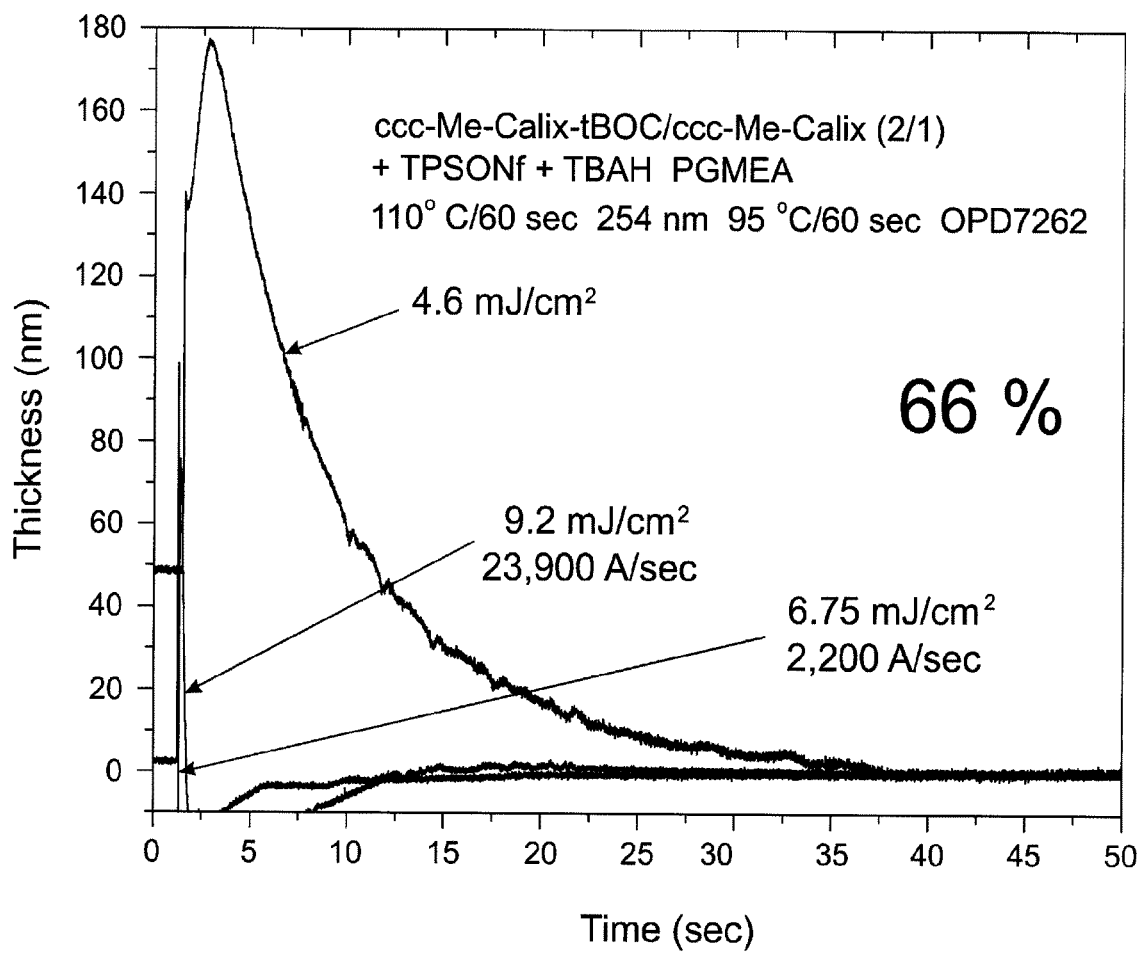

FIGS. 18-20 graphically illustrate the dissolution kinetics curves of the blend molecular glass resists with the varying amount of fully protected to unprotected calixarene in the photoresist. Similar to the data shown in Example 1, when the protection level was 33 mol %, a small amount of the unexposed photoresist film was dissolved in the developer but when the concentration of the fully-protected compound was increased to 40 mol %, no thinning of the unexposed film in the aqueous base developer was observed. The inventive photoresists with butoxycarbonyl protective groups exhibited very high dissolution swing and excellent Rmax.

Figure 21:
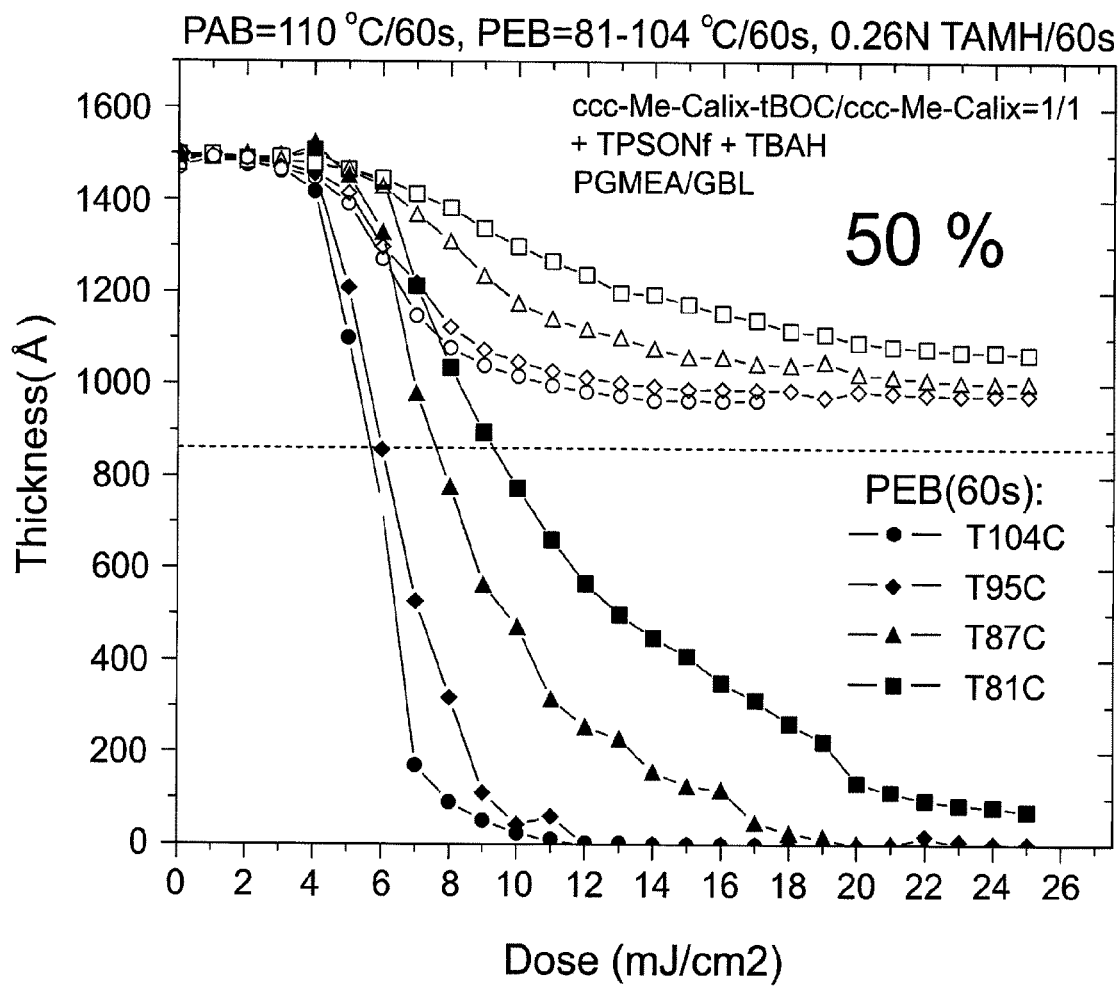
FIGS. 21-22 graphically illustrate contrast curves at 248 nm as a function of post exposure bake temperature for molecular glass resists with a varying weight percent of fully t-butoxycarbonyl protected to unprotected C-tetramethyl-calix[4]resorcinarenes in 0.26 N TMAH.
Figure 22:
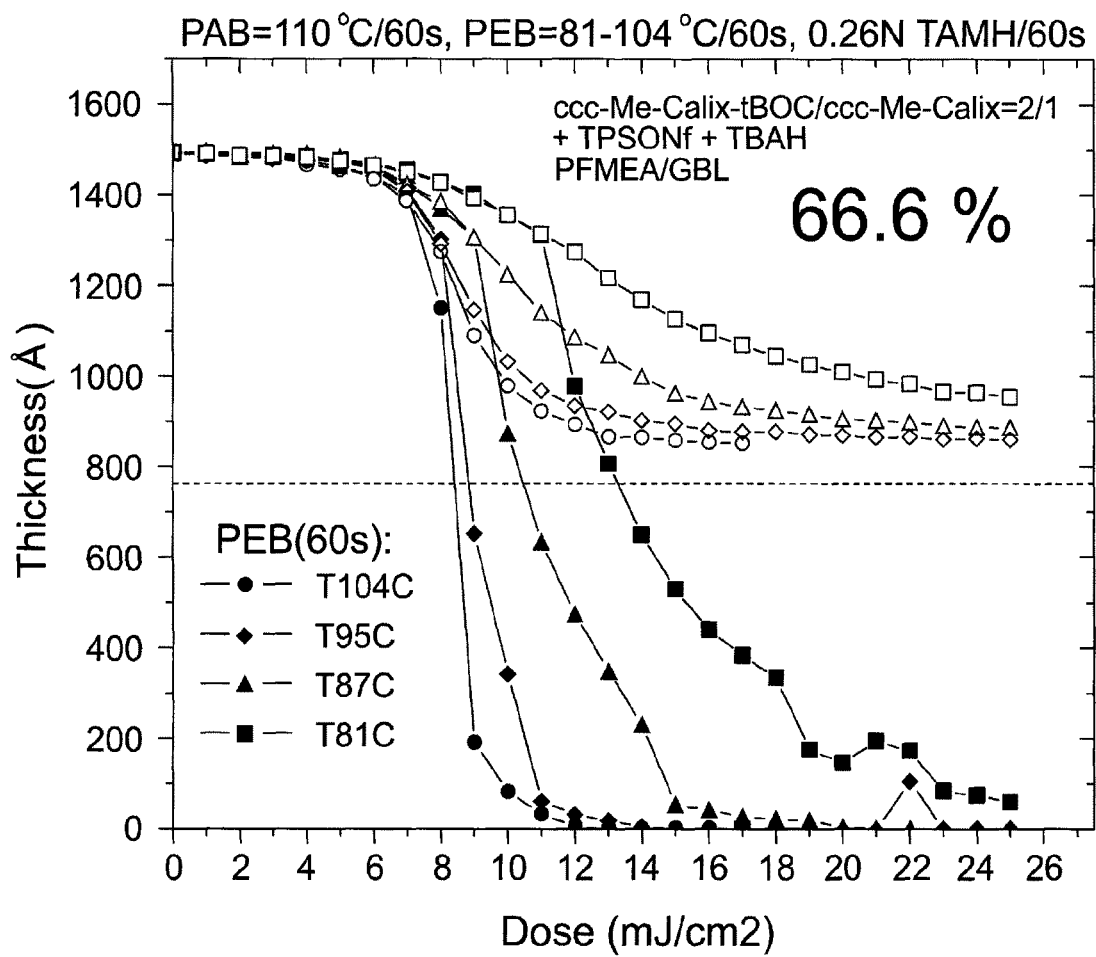

In FIGS. 21-22, contrast curves as a function of post exposure bake temperature are illustrated, wherein the photoresists included varying blends of fully protected (t-butoxycarbony) to unprotected (ccc) C-tetramethyl-calix[4]resorcinarenes by DUV (deep ultraviolet) exposure at 248 nm using an ASML stepper as a function of post exposure bake temperatures. The resists exhibited good contrast when baked at 95° C. and higher.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, and equivalents of all means or step plus function elements in the claims below are intended to include any structure, material, or for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A positive-tone photoresist composition, comprising:
   a blend of at least one fully protected calix[4]resorcinarene and at least one unprotected calix[4]resorcinarene, wherein the fully protected calix[4]resorcinarene has phenolic groups protected with an acid labile protective group;
   a photoacid generator; and
   a solvent, wherein the blend and the photoacid generator are soluble in the solvent.

2. The positive tone photoresist composition of claim 1, wherein the calix[4]resorcinarenes have a structural formula (I):

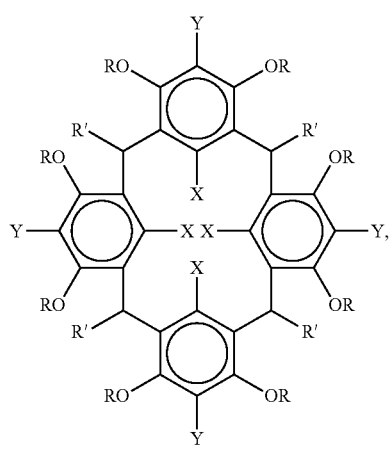

wherein the R moiety is hydrogen for the unprotected calix[4]resorcinarene and is the acid labile group for the fully protected calix[4]resorcinarene, wherein the acid labile protective groups may be the same or different; the R' moieties are independently selected from the group consisting of hydrogen, alkyl aryl, and alkaryl, and if alkyl, aryl or alkaryl for both the fully protected and the unprotected calix[4]resorcinarenes, optionally substituted with one to four substituents selected from the group consisting of hydroxyl, halogen, lower alkyl, lower alkoxy and nitro; and, the X and Y moieties may be the same or different and are selected from the group consisting of hydrogen, alkyl, alkoxy, aryl, arakyl, alkaryl, halo, cyano, nitro, and carboxylate for both the fully protected and the unprotected calix[4]resorcinarenes.

3. The positive tone photoresist composition of claim 1, wherein the acid labile protecting group has a structural formula (II):

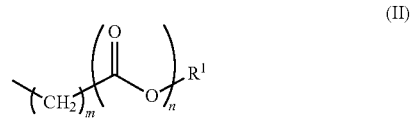

wherein m is 0 or 4, n is 0 or 1, and R' is $CR^2R^3R^4$, $SiR^5R^6R^7$ or $GeR^5R^6R^7$, wherein $R^2$, $R^3$ and $R^4$ are independently hydrogen, alkyl, alkoxy, aryl, or aryloxy, and wherein $R^5$, $R^6$ and $R^7$ are the same or different and are each an alkyl.

4. The positive tone photoresist composition of claim 1, wherein the at least one fully protected or the at least one fully protected calix[4]resorcinarene has a structure selected from the group consisting of C-tetramethyl-calix[4]resorcinarene, C-tetraphenyl-calix[4]resorcinarene, and C-isopropylphenyl-calix[4]resorcinarene.

5. The positive tone photoresist composition of claim 1, wherein each of the at least one fully protected calix[4]resorcinarene and the at least one unprotected calix[4]resorcinarene is a (ccc) isomer.

6. The positive tone photoresist composition of claim 1, wherein each of the at least one fully protected calix[4]resorcinarene and the at least one unprotected calix[4]resorcinarene is a (ctt) isomer.

7. The positive tone photoresist composition of claim 1, wherein each of the at least one fully protected calix[4]resorcinarene and the at least one unprotected calix[4]resorcinarene are a mixture of (ccc) and (ctt) isomers.

8. The positive tone photoresist composition of claim 1, wherein the at least one fully protected calix[4]resorcinarene is at least 25 mol % of the blend.

9. The positive tone photoresist composition of claim 1, further comprising a pigment, a sensitizer, a preservative, an acid-diffusion controlling agent, an adhesion promoter, a coating aid, a plasticizer, a surface modifying agent, and/or a dissolution inhibitor.

10. The positive tone photoresist composition of claim 1, wherein the at least one fully protected calix[4]resorcinarene is 25 to 90 mol %.

11. A process for generating a resist image on a substrate, comprising:
   coating a substrate with a film comprising the resist composition comprising a blend of at least one fully protected calix[4]resorcinarene and at least one unprotected calix[4]resorcinarene, a photoacid generator, and a solvent;
   imagewise exposing the film to radiation to form latent image therein; and
   developing the resist image with an aqueous base developer.

12. The process of claim 11, wherein the calix[4]resorcinarenes have a structural formula (I):

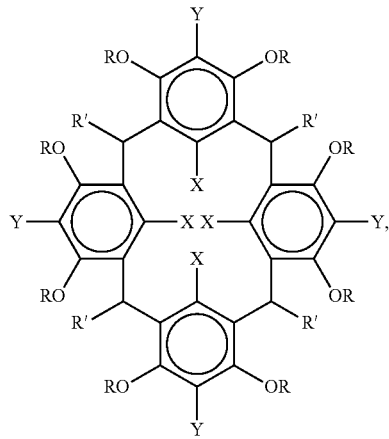

(I)

wherein the R moiety is hydrogen for the unprotected calix[4]resorcinarene and is the acid labile group for the fully protected calix[4]resorcinarene, wherein the acid labile protective groups may be the same or different; the R' moieties are independently selected from the group consisting of hydrogen, alkyl, and alkaryl, and if alkyl, aryl or alkaryl for both the fully protected and the unprotected calix[4]resorcinarenes, optionally substituted with one to four substituents selected from the group consisting of hydroxyl, halogen, lower alkyl, lower alkoxy and nitro; and, the X and Y moieties may be the same or different and are selected from the group consisting of hydrogen, alkyl, alkoxy, aryl, arakyl, alkaryl, halo, cyano, nitro, and carboxylate for both the fully protected and the unprotected calix[4]resorcinarenes.

13. The process of claim 11, wherein the acid labile protecting groups have a structural formula (II):

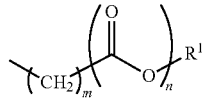

(II)

wherein m is 0 or 4, n is 0 or 1, and $R^1$ is $CR^2R^3R^4$, $SiR^5R^6R^7$ or $GeR^5R^6R^7$, wherein $R^2$, $R^3$, and $R^4$ are independently hydrogen, alkyl, alkoxy, aryl, or aryloxy, and wherein $R^5$, $R^6$ and $R^7$ are the same or different and are each an alkyl.

14. The process of claim 11, wherein the calix[4]resorcinarene is selected from the group consisting of C-tetramethyl-calix[4]resorcinarene, C-tetraphenyl-calix[4]resorcinarene, and C-isopropylphenyl-calix[4]resorcinarene.

15. The process of claim 11, wherein each of the at least one fully protected calix[4]resorcinarene and the at least one unprotected calix[4]resorcinarene is a (ctt) isomer.

16. The process of claim 11, wherein each of the at least one fully protected calix[4]resorcinarene and the at least one unprotected calix[4]resorcinarene is a (ccc) isomer.

17. The process of claim 11, wherein the at least one fully protected calix[4]resorcinarene and the at least one unprotected calix[4]resorcinarene are a mixture of (ccc) and (ctt) isomers.

18. The process of claim 11, wherein subsequent to imagewise exposing the film to radiation and prior to developing, the film is heated to a temperature within a range of 25° C. to 150° C.

19. The process of claim 11, wherein the radiation is ultraviolet radiation, x-ray, EUV, or electron beam.

20. The process of claim 11, further comprising a pigment, a sensitizer, a preservative, an acid-diffusion controlling agent, an adhesion promoter, a coating aid, a plasticizer, a surface modifying agent, and/or a dissolution inhibitor.

* * * * *